US006516456B1

(12) United States Patent
Garnett et al.

(10) Patent No.: US 6,516,456 B1
(45) Date of Patent: Feb. 4, 2003

(54) METHOD AND APPARATUS FOR SELECTIVELY VIEWING NETS WITHIN A DATABASE EDITOR TOOL

(75) Inventors: Robert E. Garnett, Roseville, MN (US); Joseph P. Kerzman, New Brighton, MN (US); James E. Rezek, Mounds View, MN (US); Mark D. Aubel, Essex Jct., VT (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 08/789,027

(22) Filed: Jan. 27, 1997

(51) Int. Cl.[7] .............................................. G06F 17/50
(52) U.S. Cl. ................................ 716/8; 716/9; 716/10; 716/11; 716/12; 716/13; 716/14
(58) Field of Search ................................ 364/488, 489, 364/490, 491; 716/8–14

(56) References Cited

U.S. PATENT DOCUMENTS

| | | | |
|---|---|---|---|
| 4,758,953 A | 7/1988 | Morita et al. | |
| 4,831,543 A | 5/1989 | Mastellone | |
| 4,918,614 A | 4/1990 | Modarres et al. | |
| 4,970,664 A | * 11/1990 | Kaiser et al. | 364/488 |
| 5,050,091 A | 9/1991 | Rubin | |
| 5,164,908 A | 11/1992 | Igarashi | |
| 5,175,696 A | 12/1992 | Hooper et al. | |
| 5,222,029 A | 6/1993 | Hooper et al. | |
| 5,255,363 A | 10/1993 | Seyler | |
| 5,267,175 A | 11/1993 | Hooper | |
| 5,341,309 A | 8/1994 | Kawata | |
| 5,349,659 A | 9/1994 | Do et al. | |
| 5,355,317 A | 10/1994 | Talbott et al. | |
| 5,357,440 A | 10/1994 | Talbott et al. | |
| 5,359,523 A | 10/1994 | Talbott et al. | |
| 5,359,537 A | 10/1994 | Saucier et al. | |
| 5,361,357 A | 11/1994 | Kionka | |
| 5,398,195 A | 3/1995 | Kim | |
| 5,406,497 A | 4/1995 | Altheimer et al. | |
| 5,416,721 A | 5/1995 | Nishiyama et al. | |
| 5,418,733 A | 5/1995 | Kamijima | |
| 5,418,954 A | 5/1995 | Petrus | |
| 5,440,720 A | 8/1995 | Baisuck et al. | |
| 5,483,461 A | 1/1996 | Lee et al. | |
| 5,485,396 A | 1/1996 | Brasen et al. | |

(List continued on next page.)

OTHER PUBLICATIONS

Tufte, "CML III Bipolar Standard Cell Library", Proceedings of the 1988 Bipolar Circuits and Technology Meeting, Minneapolis, Minnesota, Sep., 1988, pp. 180–182.

Primary Examiner—Hugh M. Jones
(74) Attorney, Agent, or Firm—Charles A. Johnson; Mark T. Starr; Nawrocki, Rooney & Sivertson P.A.

(57) ABSTRACT

A method and apparatus for selectively viewing nets within a database editor tool. The present invention provides four primary features for selectively viewing nets. First, the present invention contemplates selecting a number of objects, and viewing only those nets that are either driven from or received by the selected objects. In a preferred embodiment, the number of objects are placed objects within a placement tool. Second, for those nets that are selected, and that are also coupled to un-placed cells, the present invention contemplate providing fly-wires from the corresponding selected objects to a predetermined location representative of an approximate expected location for the un-placed cells. Third, the present invention contemplate providing a vector filter which may permit only vectored nets with a selected bus width range to be viewed. Finally, the fourth feature of the present invention contemplates providing a means for selectively viewing only those nets that cross a predetermined hierarchical boundary within the circuit design database.

49 Claims, 21 Drawing Sheets

U.S. PATENT DOCUMENTS

| | | |
|---|---|---|
| 5,490,266 A | 2/1996 | Sturges |
| 5,490,268 A | 2/1996 | Matsunaga |
| 5,491,640 A | 2/1996 | Sharma et al. |
| 5,493,508 A | 2/1996 | Dangelo et al. |
| 5,546,320 A * | 8/1996 | Biro et al. .................. 364/488 |
| 5,548,524 A * | 8/1996 | Hernandez et al. ......... 364/489 |
| 5,555,201 A * | 9/1996 | Dangelo et al. ............... 716/1 |
| 5,586,047 A * | 12/1996 | Imahashi .................... 364/491 |
| 5,617,327 A * | 4/1997 | Duncan ..................... 364/489 |
| 5,691,912 A * | 11/1997 | Duncan ..................... 364/490 |
| 5,754,442 A * | 5/1998 | Minagawa et al. ......... 364/489 |

\* cited by examiner

METHOD AND APPARATUS FOR SELECTIVELY VIEWING NETS WITHIN A DATABASE EDITOR TOOL

CROSS REFERENCE TO CO-PENDING APPLICATIONS

The present application is related to U.S. patent application Ser. No. 08/789,025, filed Jan. 27, 1997, entitled "Method and Apparatus for Efficiently Viewing a Number of Selected Components Using a Database Editor Tool", U.S. patent application Ser. No. 08/789,026, filed Jan. 27, 1997, entitled "Method and Apparatus for Selecting Components Within a Circuit Design Database", U.S. patent application Ser. No. 08/789,028, filed Jan. 27, 1997, entitled "Method and Apparatus for Associating Selected Circuit Instances and for Performing a Group Operation Thereon", U.S. patent application Ser. No. 08/789,024, filed Jan. 27, 1997, entitled "Method and Apparatus for Identifying Physical Errors in a Placement Database", U.S. patent application Ser. No. 08/789,029, filed Jan. 27, 1997, entitled "Method and Apparatus for Using a Placement Tool to Manipulate Cell Substitution Lists", U.S. patent application Ser. No. 08/598,506, filed Feb. 7, 1996 entitled "Method and Apparatus for Performing Drive Strength Adjust Optimization in a Circuit Design", U.S. patent application Ser. No. 08/597,931, filed Feb. 7, 1996 entitled "Method and Apparatus for Resolving Conflicts Between Cell Substitution Recommendations Provided by a Drive Strength Adjust Tool", all of which are assigned to the assignee of the present invention.

BACKGROUND OF THE INVENTION

1. Field of the Invention

The present invention generally relates to a method and apparatus for manipulating a group of instances of a circuit design database, and more particularly relates to a method and apparatus for associating selected instances within the circuit design database, and for performing a group operation thereon.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks. The names of the building blocks are specified by the circuit designer. Thus, they usually are logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

Another common method for specifying the integrated circuit design is the use a schematic capture tool. A schematic capture tool allows the circuit designer to directly enter the schematics for the circuit design. Unlike a hardware description language, the resulting schematics often completely specify the logical and functional relationships among the components of the design.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip.

The user-defined blocks can then be used to design larger blocks of greater complexity. The user-defined blocks are added to the design library, which grows from the additions of new design modules as the design evolves. The top level of the design hierarchy may be a single block that defines the entire design, and the bottom layer of the hierarchy may consist of leaf cells, the cells (i.e., the logical components) that were originally provided in the cell library. Note that the hierarchy is typically structured as a special kind of a graph called a tree. This resulting data structure is called a detailed (or gate-level) description of the logic design.

The generation of the detailed description is often accomplished by logic design synthesis software for HDL entry. The logic design synthesis software generates a gate-level description of user-defined input and output logic, and also creates new gate-level logic to implement user-defined logical functions. Constituent parts of new gate-level logic created during each pass through the logic design synthesis software are given computer-generated component and net names. Each time the logic design synthesis software is executed for the integrated circuit design, the component and net names which are generated by the software, and not explicitly defined by the user, may change, depending on whether new logic has been added to or deleted from the integrated circuit design. Typically, the logic design synthesis software is executed many times during the integrated circuit design process, because errors may be detected during the simulation and testing phases of the design cycle and then fixed in the behavioral description.

The output of the design capture and synthesis tools is a logic design database which completely specifies the logical and functional relationships among the components of the design. Once the design has been converted into this form, it may be optimized by sending the logic design database to a logic optimizer tool implemented in software. The logic optimizer may remove logic from the design that is unnecessary, or otherwise improve the overall efficiency of the design. It is noted, however, that this action typically affects the component and net names generated by the logic synthesis tool.

It is also necessary to verify that the logic definition is correct and that the integrated circuit implements the function expected by the circuit designer. This verification is currently achieved by estimated timing and simulation software tools. The design undergoes design verification analysis in order to detect flaws in the design. The design is also analyzed by simulating the device resulting from the design to assess the functionality of the design. If errors are found or the resulting functionality is unacceptable, the designer modifies the behavior description as needed. These design iterations help to ensure that the design satisfies its requirements. As a result of each revision to the design, the logic design synthesis-generated instance and net names may completely change. Further, the changes made by the logic optimizer may not be precisely known. Thus, the EDA tools downstream in the design process from the logic design synthesis software must be re-executed on the entire design.

After timing verification and functional simulation has been completed on the design, placement and routing of the design's components is performed. These steps involve assigning components of the design to locations on the integrated circuit chip and interconnecting the components to form nets. This may be accomplished using automated place and route tools.

Because automatic placement tools may not yield an optimal design solution, particularly for high performance designs that have strict timing and physical requirements, circuit designers often manually place critical circuit objects (e.g. cells or regions) within the boundary of the integrated circuit. This may be accomplished by using a commercially available placement directive tool (also known as a floorplanning tool), typically implemented in software. The placement tool may include a graphics terminal that provides the circuit designer with visual information pertaining to the circuit design. This information is typically contained in several different windows.

A floorplanning window may display a graphical representation of, for example, the die area of an integrated circuit, the placed objects and connectivity information. Similarly, a placed physical window may display the alphanumeric names of all placed cells and hierarchical regions. An un-placed physical window may display the alphanumeric names of all un-placed cells and hierarchical regions. A logic window may display a hierarchical tree graph of the circuit design.

During the placement process, the circuit designer may select the name of a desired object from the un-placed physical window displaying the un-placed objects. After this selection, the placement tool may retrieve the physical representation of the selected object, and the circuit designer may use the cursor to position the physical representation of the selected object within the floorplanning window. The placement tool may then move the alphanumeric instance name of the selected object from the un-placed physical window to the placed physical window to indicate the placement thereof.

To edit the placement of desired objects, the circuit designer may select the desired physical representation of the object from the floorplanning window using a pointing device. The circuit designer may, for example, draw a rectangle around the desired objects to affect the selection. After selection, the circuit designer may instruct the placement tool to perform a desired editing function on the selected objects.

Some placement tools may allow the circuit designer to select a desired level of hierarchy or region as the current working environment, or "context". When the context is set, all of the objects existing at the next lower level in the circuit design hierarchy are displayed in one of the physical windows, thus making them available for placement or editing. These objects are called children objects of the selected context, and may include other hierarchical objects, including regions and/or cells. Thus, a context may include a mixture of regions and cells.

In this environment, circuit designers may perform preliminary placement by first placing selected regions. In some placement tools, the outer boundary of the regions is appropriately sized to accommodate all underlying objects, even though all of the objects may not yet be placed. The circuit designer may then rely on an automated placement tool to subsequently place the underlying objects within the boundary of the region. If more detailed placement is required because of timing, physical or other constraints, selected lower level regions or cells may be manually placed by the circuit designer.

A goal of manual placement may be to minimize the net length between objects, and in particular, to minimize the net lengths of those nets that are critical to the performance of the overall circuit design. A shorter net length may produce a reduced capacitance, and may thus directly increase the performance of the design. Further, because of the shorter net lengths, there may be less net cross over and routing congestion, and the resulting design may be smaller in overall size.

Vectored nets are often given special consideration by circuit designers, particularly since vectored nets may correspond to the critical data and/or address paths within a circuit design. For this reason, a large percentage of the manual placement performed by a circuit designer may involve the placement of objects that drive or receive vectored nets.

After selected objects have been manually placed by a circuit designer, it may be desirable to analyze the resulting net connectivity to determine the desirability of the placement. Prior art placement tools typically only allow the circuit designer to view all placed cells, and all net connectivity associated therewith. The net connectivity is typically displayed using fly wires or the like. In complex designs, however, there may be many overlapping fly-wires that appear as a "rats nets", and thus it may be difficult to identify those flywires that are associated with a particular data path. In addition, the circuit designer typically may not be able to view those nets that are associated with yet un-placed objects, and thus may not be able to identify potential regions of high routing congestion. All of these limitations may reduce the overall effectiveness of a placement tool.

SUMMARY OF THE INVENTION

The present invention overcomes many of the disadvantages of the prior art by providing a method and apparatus for selectively viewing nets within a database editor tool. The present invention provides four primary features for selectively viewing nets. First, the present invention contemplates selecting a number of objects, and viewing only those nets that are either driven from or received by the selected objects. In a preferred embodiment, the number of objects are placed objects within a placement tool. Second, for those nets that are selected, and that are also coupled to un-placed cells, the present invention contemplated providing fly-wires from the corresponding selected objects to a predetermined location representative of an approximate expected placement location for the un-placed cells. Third, the present invention contemplated providing a vector filter which may permit only vectored nets with a selected bus width range to be viewed. Finally, the fourth feature of the present invention contemplates providing a means for selectively viewing only those nets that cross a predetermined hierarchical boundary within the circuit design database.

It is recognized that any database editor tool may be used or adapted to be used in accordance with the present invention. Some examples of database editor tools that may be used include schematic entry tools, place and route tools, simulation tools, floorplanning tools, or any other tool that allows the circuit designer to view and/or edit a representation of a circuit design. As indicated above, and in a preferred embodiment, the database editor tool is a placement tool (e.g. floorplanning) tool.

The first feature, as described above, allows a circuit designer to select a number of objects, and view only those nets that are either driven from or received by the selected objects. This feature may be particularly useful when a circuit designer desires to view a vectored net. The circuit designer may select the objects that either drive or receive the bits of a vectored net, and the present invention may then display only those nets on the display device. By examining only the nets associated with the vectored net, the circuit designer may more readily evaluate the placement of the objects that drive or receive the nets.

In a preferred embodiment, the circuit designer may select all objects that are associated with a vectored net by using a stack mode feature. A stack mode feature may allow the circuit designer to select all of the objects associated with a vectored net by simply selecting one of the associated objects. A further discussion of the stack feature can be found in U.S. patent application Ser. No. 08/789,028, filed Jan. 27, 1997, entitled "Method and Apparatus for Associating Selected Circuit Instances and for Performing a Group Operation Thereon".

Finally, it is contemplated that the first feature may be used in conjunction with any database editor tool, as described above. However, in a preferred embodiment the database editor tool is a placement tool, and the selected objects are placed objects within a placement database.

The second feature, allows the circuit designer to display not only the portion of the nets that extend between selected objects, but estimates the position of the portion of the nets that extend to yet un-placed objects. For example, if a first placed object drives a net, and a second placed object receive the net, the present invention may display a flywire between the first object and the second object. However, if a third un-placed object also receive the net, the present invention contemplates displaying a flywire to an estimated placement location for the third un-placed object. This may help identify potential regions of high routing congestion and/or suggest to a circuit designer a desirable placement location for the third un-placed object.

The third feature of the present invention, as described above, contemplated providing a vector filter which may permit only vectored nets with a selected bus width range to be viewed. That is, the circuit designer may specify a bus width range, and a vector filter may then filter those nets that fall within the specified bus width. The resulting nets may then be displayed on a display device. This feature may allow a circuit designer to, for example, display only those nets within a circuit design that are directly associated with a selected data or address path. This may allow the circuit designer to more readily analyze the placement of the objects that are associated with the selected data or address path.

Finally, the fourth feature of the of the present invention contemplates providing a means for selectively viewing only those nets that cross a predefined hierarchical boundary within the circuit design database. This feature may allow a circuit designer to more readily identify those nets that enter or exit a particular region. Further, this feature may enable a circuit designer to more readily trace a net through the circuit design hierarchy.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
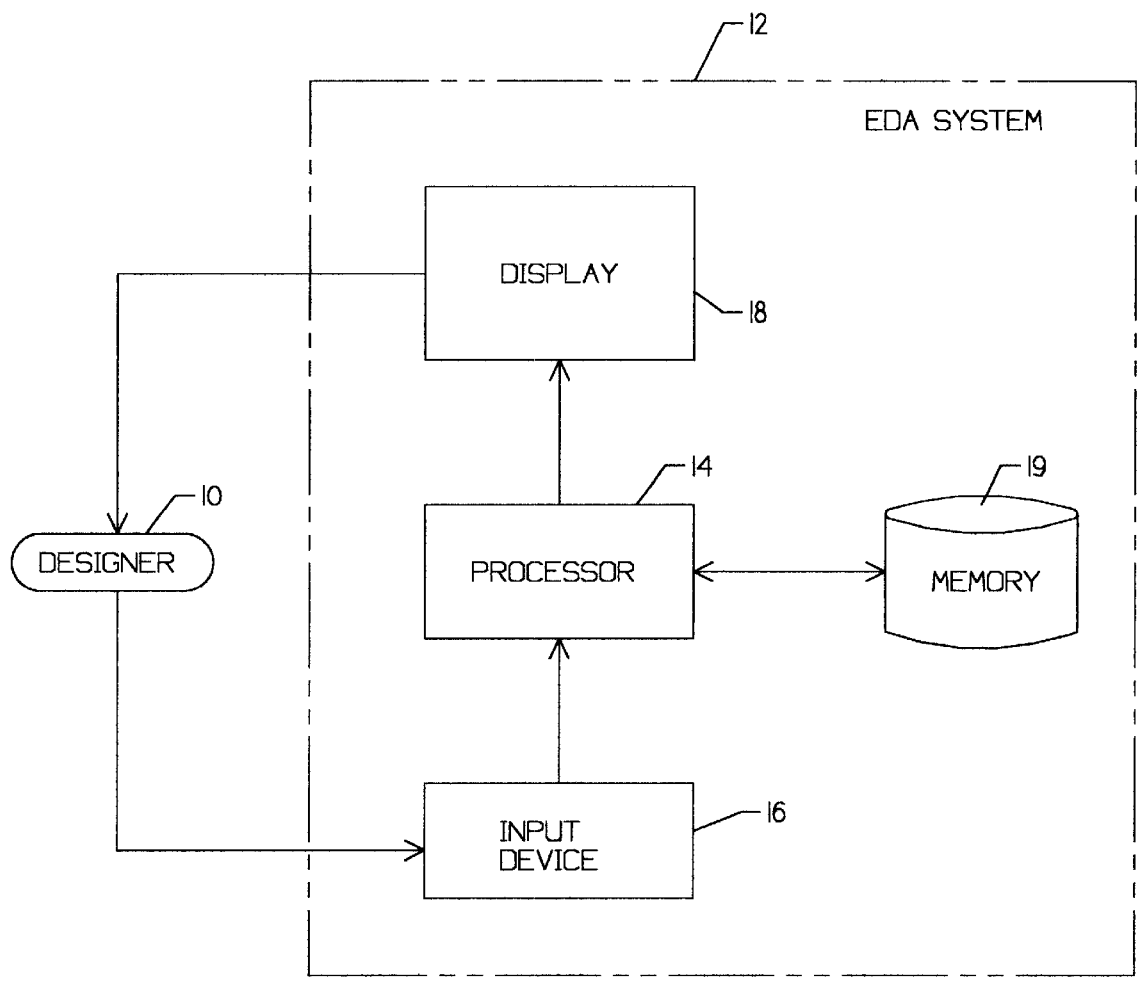
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Integrated circuit designers describe the high-level logical representation of a design in terms of equations. This logical representation is called a "behavior" description. The behavior description is simulated and verified to assure that it conforms to the desired specifications. Once the behavior description of the integrated circuit has been verified, it is transformed into a detailed description (also known as a structural or gate-level description). This conversion process is called synthesis. The detailed description represents the equation-based behavior description in the form of gate-level objects (components) and the connections (nets) between the objects. The detailed description is used for the remaining design processes. The detailed description is used to simulate the design at the gate level, establish the initial physical component placement (floorplan), complete the final physical component placement and net interconnect routing (layout), perform delay calculation and timing analysis, and generate test patterns for manufacturing verification. During these remaining design processes, there are various attribute types and attribute values attached to the detailed description. Some of these attributes are generated by the integrated circuit designer (via software tool or tools), while other attributes are generated by the EDA software system. Names of components and nets are one of the main software-generated attributes.

Physical attribute values, especially component placement and interconnect routing coordinates, are contingent upon a name-based design. In other words, each attribute and its value is associated with a given name and the object the name represents. For the physical floorplanning process, a pair of X,Y coordinates (i.e., the physical attribute and given values) are associated with each component in the design. This process is controlled by the designer, but with assistance from the EDA software. For the physical layout process, the X,Y coordinates (again, the physical attribute and given values) are also associated with a specific component and its interconnect (net). This process usually includes a manual and automated portion, executed by the circuit designer and EDA software.

FIG. 1 is a block diagram of the computer-based environment of the present invention. A Designer 10 interacts with an electronic design automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 19. The Memory may take the form of a semiconductor memory, magnetic disks, optical disks, magnetic tape or other mass storage device.

Figure 2:
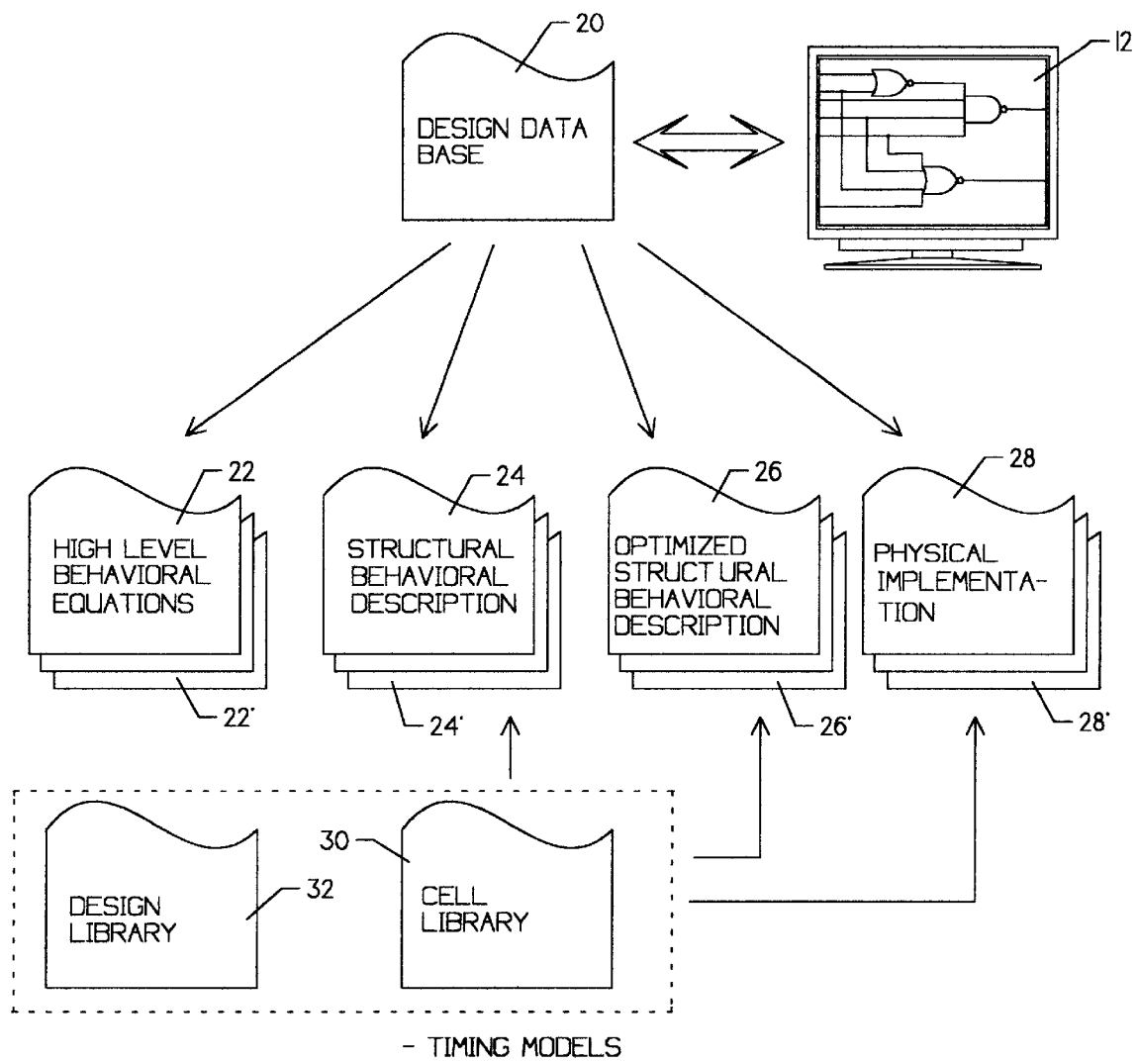
FIG. 2 is a block diagram showing typical circuit representations stored within a circuit design database.

FIG. 2 is a block diagram showing a number of circuit representations stored within a typical circuit design database. For example, the design database may include a high level behavioral representation 22, a structural behavioral description representation 24, an optimized structural behavioral representation 26, and a physical representation 28.

As indicated above, the circuit designer typically specifies the logic design of an integrated circuit by using design capture software that runs on an electronic design automation system 12. In the preferred embodiment, the Hardware Computer-Aided Design System (HCADS), available from Unisys Corporation, is used as Design Capture software, although other design capture programs from companies such as Cadence Design Systems, Inc., Synopsys, Inc., and Mentor Graphics, Inc., are also commercially available. At a minimum, when using a hardware description language, any text editor program may be used to specify the design. The result of this activity is a high level behavior description representation 22, which typically represents the logic design as specified at the register transfer level. Items in the high level behavior description representation 22 map to functional components of the design. In the preferred embodiment, the high level behavior description representation 22 is written in a design language called Universal Design Source Language (UDSL), although other existing, well-known hardware design languages, such as VHDL or verilog, could also be used.

The high level behavior description representation 22 may be input to a logic design synthesis tool. The logic design synthesis tool may assign the gates and other circuitry needed to implement the functions specified by the high level behavior description representation 22. In the preferred embodiment, the synthesis software comprises the Behavior to Structure Translator (BEST) synthesis tool developed by Unisys Corporation. However, alternate embodiments such as the VHDL Design Compiler commercially available from Synopsys, Inc., the DesignBook Synthesis tool from Escalade, and the Synergy synthesis tool available from Cadence Design Systems, Inc. may also be used.

The Logic Design Synthesis tool may output a structural behavioral description representation 24, which is sometimes referred to as the net list for the design. This file contains the gate-level definition of the logic design. The structural behavioral description representation 24 may be in the Prime Behavior Description Language ('BDL), a format developed and used by the Unisys Corporation.

The structural behavioral description representation 24 may be provided to other EDA software programs, including an optimization program. The circuit optimization tool may read the structural behavioral description representation 24 and optimize the logic represented therein. Typically, the optimization tool may read and write Electronic Data Interchange Format (EDIF) files. The EDIF format is an industry standard format for hardware design language information. Thus, embedded within a typical optimization tool is an EDIF reader and an EDIF writer. The EDIF writer and reader translate the circuit design database 20 from an internal format to and from the EDIF format. It is recognized that the EDIF reader and EDIF writer programs may have to be provided by the user, depending on the format of the internal circuit design database.

The optimization methodology used by the optimization tool may be selectable by the user. For example, the user may direct the optimization tool to optimize a particular portion of the circuit design such that power, area, speed or other predefined parameter is optimized. Further, the optimization program may optimize the structural behavioral description representation 24 using components from a selected cell library 30 or design library 32. The optimization program may provide an optimized structural behavioral description representation, as shown at 26. In the preferred embodiment, the optimization program is the Design Compiler, commercially available from Synopsys, Inc.

The optimized structural behavioral description representation 26 may then be placed and routed using a commercially available place and route tool. In the preferred embodiment, the place and route tool Gate Ensemble provided by Cadence Design Systems, Inc. is utilized, although other firms active in the electronic design automation (EDA) industry sell systems similar in function to the above-mentioned Cadence tool.

The result may be stored in the circuit design database 20 as a physical implementation representation 28. As shown in FIG. 2, typical cell libraries include a number of representations of each component therein including a symbol representation, a schematic representation and a physical representation. This is also true for components in the design library 32. The physical implementation representation 28 of the circuit design database 20 typically includes references to the physical representation of the library components referenced therein.

Figure 3:
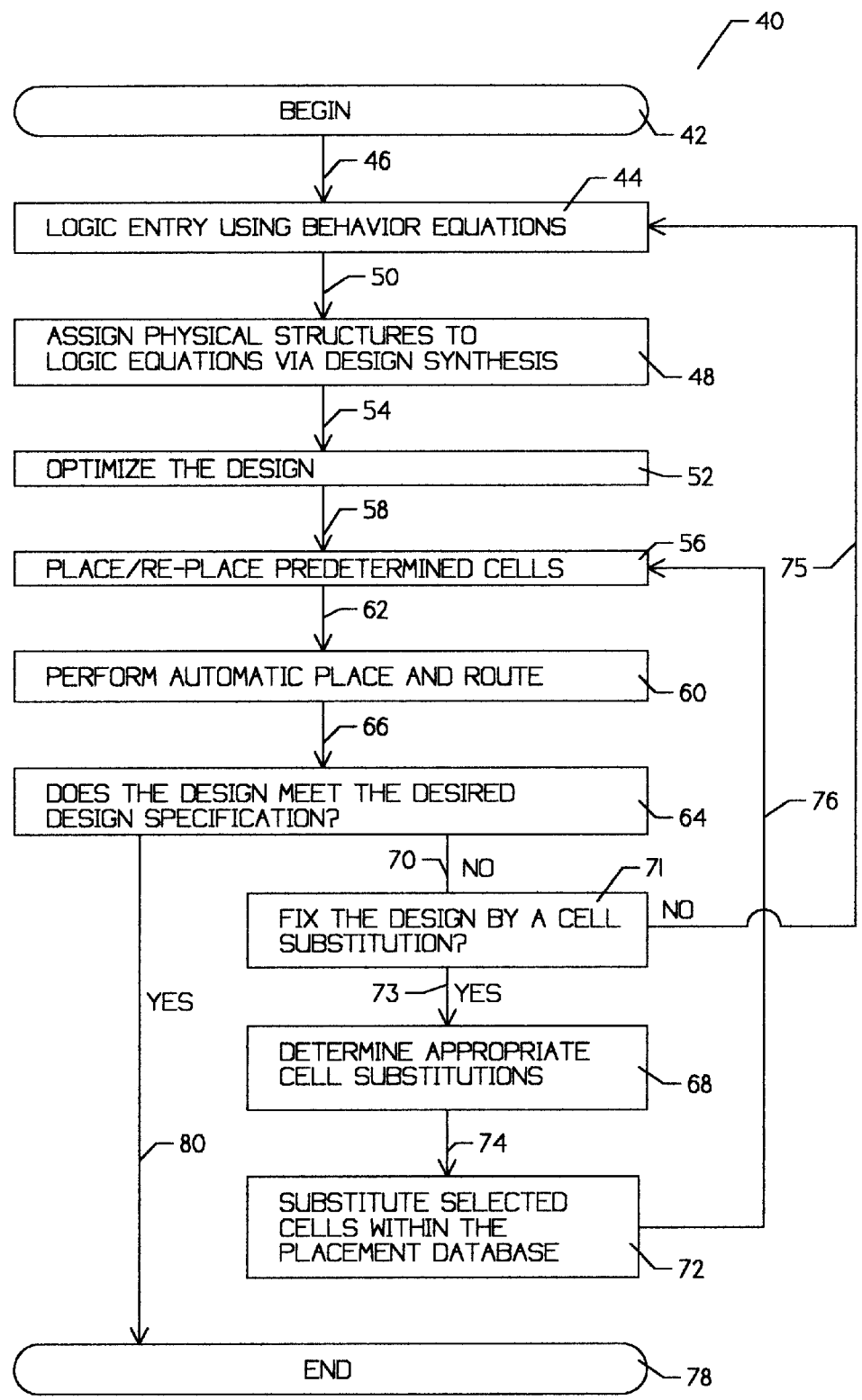
FIG. 3 is a flow diagram showing illustrative design steps in accordance with an exemplary embodiment of the present invention.

FIG. 3 is a flow diagram showing illustrative design steps in accordance with an exemplary embodiment of the present invention. The flow diagram is generally shown at 40 and is entered at element 42. Control is passed to element 44 via interface 46. Element 44 allows a circuit designer to enter the logic of a circuit design using behavioral equations. Control is then passed to element 48 via interface 50. Element 48 assigns physical structures to the logic equations via design synthesis. Control is then passed to element 52 via interface 54. Element 52 optimizes the circuit design. Control is then passed to element 56 via interface 58. Element 56 places predetermined cells within the circuit design. In a preferred embodiment, this step is performed by a circuit designer using a floorplan tool. Control is then passed to element 60 via interface 62. Element 60 automatically places and routes the remainder of the circuit design. Control is then passed to element 64 via interface 66. Element 64 determines whether the design meets the desired design specification.

If the design does not meet the desired design specification, control is passed to element 71 via interface 70. Element 71 determines whether the design can likely be corrected by a cell substitution. If the design can likely be corrected by a cell substitution, control is passed to element 68 via interface 73. Element 68 determines appropriate cell substitutions. Control is then passed to element 72 via interface 74. Element 72 substitutes selected cells within the placement database. Control is then passed back to element 56 via interface 76, wherein predetermined cells are re-placed. Referring back to element 71, if the design cannot be corrected by a cell substitution, control is passed to element 44 via interface 75, wherein the logic equations are modified.

The loop comprising elements 56, 60, 64, 68 and 72, and potentially the loop including elements 44, 48, 52, 56, 60, 64 and 71, is repeated until the design meets the desired design specification. Once the design meets the desired design specification, control is passed from element 64 to element 78 via interface 80, wherein the algorithm is exited. It is recognized that the above-described design flow is only exemplary, and that variations thereof are contemplated.

Figure 4:
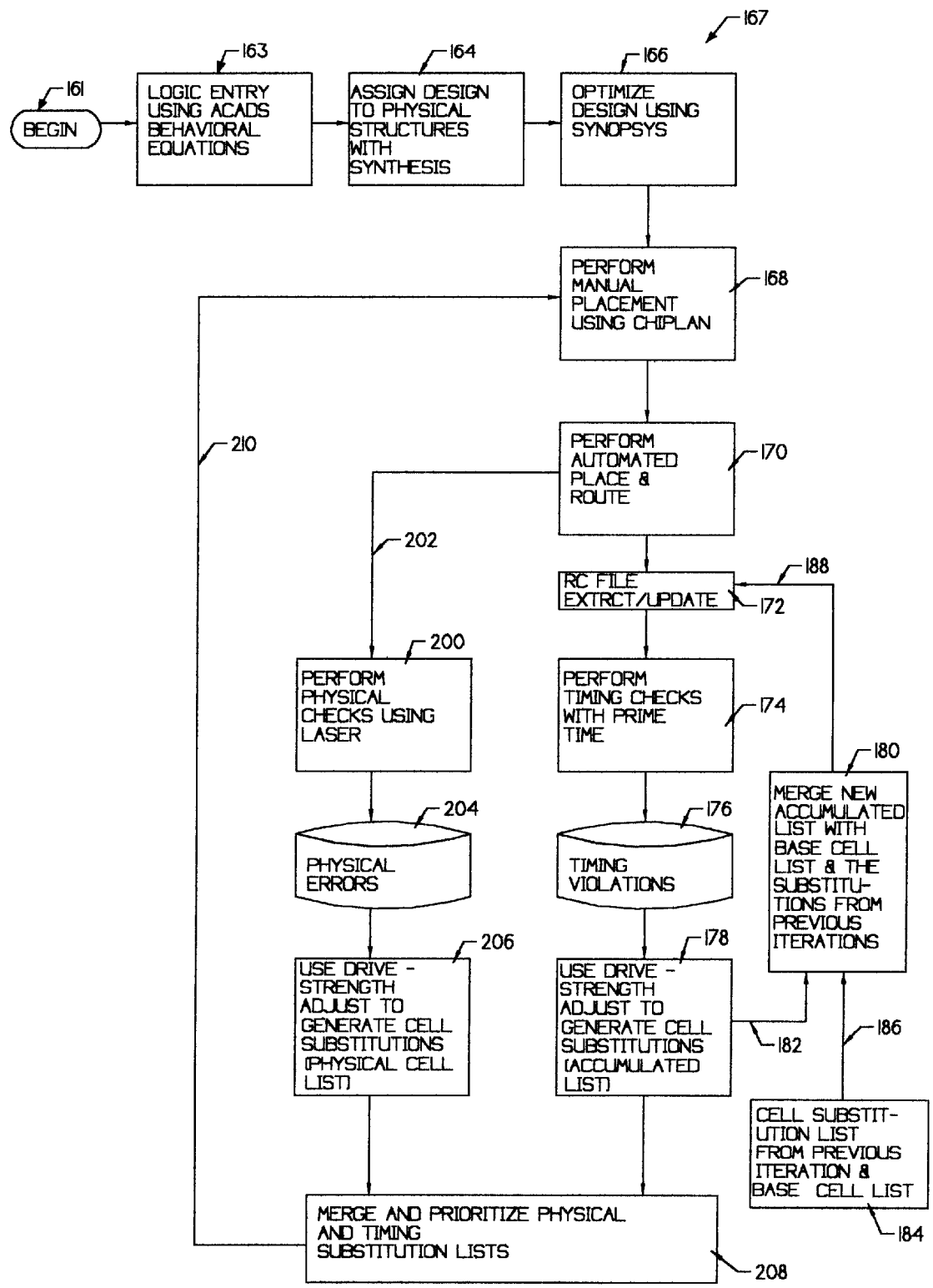
FIG. 4 is a flow diagram showing an illustrative design method in accordance with the present invention.

FIG. 4 is a flow diagram showing an illustrative design method in accordance with the present invention. The diagram is generally shown at 167. The method is entered at element 161. A logic designer typically enters logical equations describing the function of the design, as shown at 163. In the exemplary embodiment, logic entry is performed using HCADS Design Capture Software available from the Unisys Corporation. A first synthesis tool 164 may then implement the logical equations using logical cells from a component library. A second synthesis tool 166 may then minimize the logic using known techniques, and may attempt to optimize the design based on a number of predetermined factors. For example, the designer may direct the synthesis tool to optimize the design for speed, power, or some other factor. In the exemplary embodiment, a widely known synthesis tool called Design Compiler available from SYNOPSYS is used. The output of the second synthesis tool may be a design netlist, and preferably in the EDIF format.

The resulting design netlist may then be provided to a manual placement tool as shown at 168. In some cases, it is advantageous to manually place data paths, as well as certain critical cells within the design. The manual placement of these cells is typically accomplished via a floor-planning tool. Stand alone floor-planning tools are available. However, many place and route tools have at least a limited floor-planning capability. After these cells are manually placed by the designer, the remaining cells may be automatically placed and routed by the place and route tool, as shown at 170.

After the place and route netlist is generated, the designer may use an extraction tool to extract an RC file therefrom as shown at 172. The extraction tool may process the place and route netlist and may determine the resistance, capacitance, or any other parameters selected by the designer, for each net in the design. For example, the extraction tool may determine the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 174. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist, and may store a record of the timing violations as shown at 176.

If the timing analysis tool identifies timing violations, the designer must evaluate each timing violation, and provide corrections to the design to overcome such timing violations. To mitigate any timing violations that may exist, a first drive strength adjust tool 178 may be provided to identify selected components along selected timing paths to substitute with a corresponding logically equivalent component having a different drive strength, at the expense of a potential increase in size. The first drive strength adjust tool 178 is further described in U.S. patent application Ser. No. 08/598,506, filed Feb. 7, 1996 entitled "Method and Apparatus for Performing Drive Strength Adjust Optimization in a Circuit Design", and U.S. patent application Ser. No. 08/597,931, filed Feb. 7, 1996 entitled "Method and Apparatus for Resolving Conflicts Between Cell Substitution Recommendations Provided by a Drive Strength Adjust Tool".

After selected cells have been identified for substitution by the first drive strength adjust tool 178, an accumulated cell substitution list is created. The accumulated cell substitution list identifies the cells that are to be substituted during the present design iteration. The accumulated cell substitution list may be provided to a first merging step 180 via interface 182. Further, a base cell substitution list is provided to the first merging step 180 via interface 186. In the exemplary embodiment, the base cell substitution list is updated each design iteration and thus contains a master list of all cell substitutions.

The first merging step 180 merges the accumulated cell substitution list with the base cell substitution list thereby resulting in an updated base cell substitution list.

It is contemplated that the first merging step 180 may resolve any conflict between the accumulated cell substitution list and the base cell substitution list. An example of when a conflict may arise is when a particular cell is identified in more than one timing path during different design iterations. That is, the base cell substitution list may identify a particular cell within a first timing path and may indicate that the particular cell is to be substituted with a logically equivalent cell having a first drive strength. The accumulated cell substitution list, and during the current design iteration, may also identify the same cell within a second timing path and may indicate that the particular cell is to be substituted with a logically equivalent cell having a second drive strength. It is contemplated that the first merging step 180 may resolve this and other conflicts. In a preferred embodiment, the conflict is resolved based upon a predetermined priority scheme. Further details of the preferred priority scheme may be found below.

The updated base cell substitution list may be provided to the extracting tool 172, wherein an updated RC file may be generated and provided to the timing analysis tool 174 for the next design iteration. The extraction tool 172 may process the original place and route netlist and the updated base cell substitution list and may determine the resistance, capacitance, or any other parameters selected by the designer, for each net in the design.

Unlike the prior art, it is recognized that it is not necessary to repeat the place and route step 170 during each design iteration. That is, it is recognized that the placement and routing of the design does not significantly change, particularly when only cell substitutions are made to the design database. Further, it is recognized that the behavioral equations need not be updated during each design iteration. Thus, the behavioral equations need not be synthesized during each of the subsequent design iterations. This may significantly reduce the design cycle time.

In the exemplary embodiment, the process of extracting an RC file, performing timing analysis, identifying cells for substitution, creating an accumulated cell substitution list, and merging the accumulated cell substitution list with the base cell substitution list may be repeated until the design falls within the design specification, or until a predetermined number of design iterations has been reached.

In addition to the above, it is contemplated that the exemplary embodiment may perform physical checks on the circuit design as shown at 200. The physical checks step 200 may indicate any physical check violations therein, and the physical check violations may be stored as shown at 204.

If physical checks violations are detected, a second drive strength adjust tool 206 may be provided for selecting cells for substitution with a corresponding logically equivalent component having a different drive strength to mitigate such physical check violations. It is contemplated that the cells selected by the second drive strength adjust step 206 may be recorded in a physical checks substitution list as shown at 206.

After the above described timing violation design iterations are complete, and the design meets the predetermined timing specification, a second merging step 208 may merge the accumulated cell substitution list with the physical checks substitution list. It is contemplated that the second merging step 208 may resolve any conflict between the accumulated cell substitution list and the physical checks substitution list, as described above.

An example of when a conflict may arise during the second merging step 208 is when a particular cell is identified both by the first drive strength adjust tool 178 and the second drive strength adjust tool 206. That is, the accumulated cell substitution list may indicate that a particular cell is to be substituted with a logically equivalent cell having a first drive strength to correct a timing violation. The second drive strength adjust tool 206 may also identify the same cell and may indicate that the particular cell is to be substituted with a logically equivalent cell having a second drive strength to correct a physical checks violation. Preferably, these and other conflicts may be resolved using a predetermined priority scheme as described in U.S. patent application Ser. No. 08/597,931, entitled "Method and Apparatus for Resolving Conflicts Between Cell Substitution Recommendations Provided by a Drive Strength Adjust Tool, which has been incorporated herein by reference. Further details of the preferred priority scheme may be found below.

After all conflicts are resolved, the second merging step 208 may provide a final substitution list. In the exemplary embodiment, the final substitution list is provided to the manual placement tool 168 via interface 210. The designer may then make the necessary modifications to the design database. Thereafter, the design database may be provided to the place and route tool, for final placement and routing. The exemplary method may then be exited (not shown), or the process may be repeated to verify that the design database meets the circuit design specification.

Figure 5:
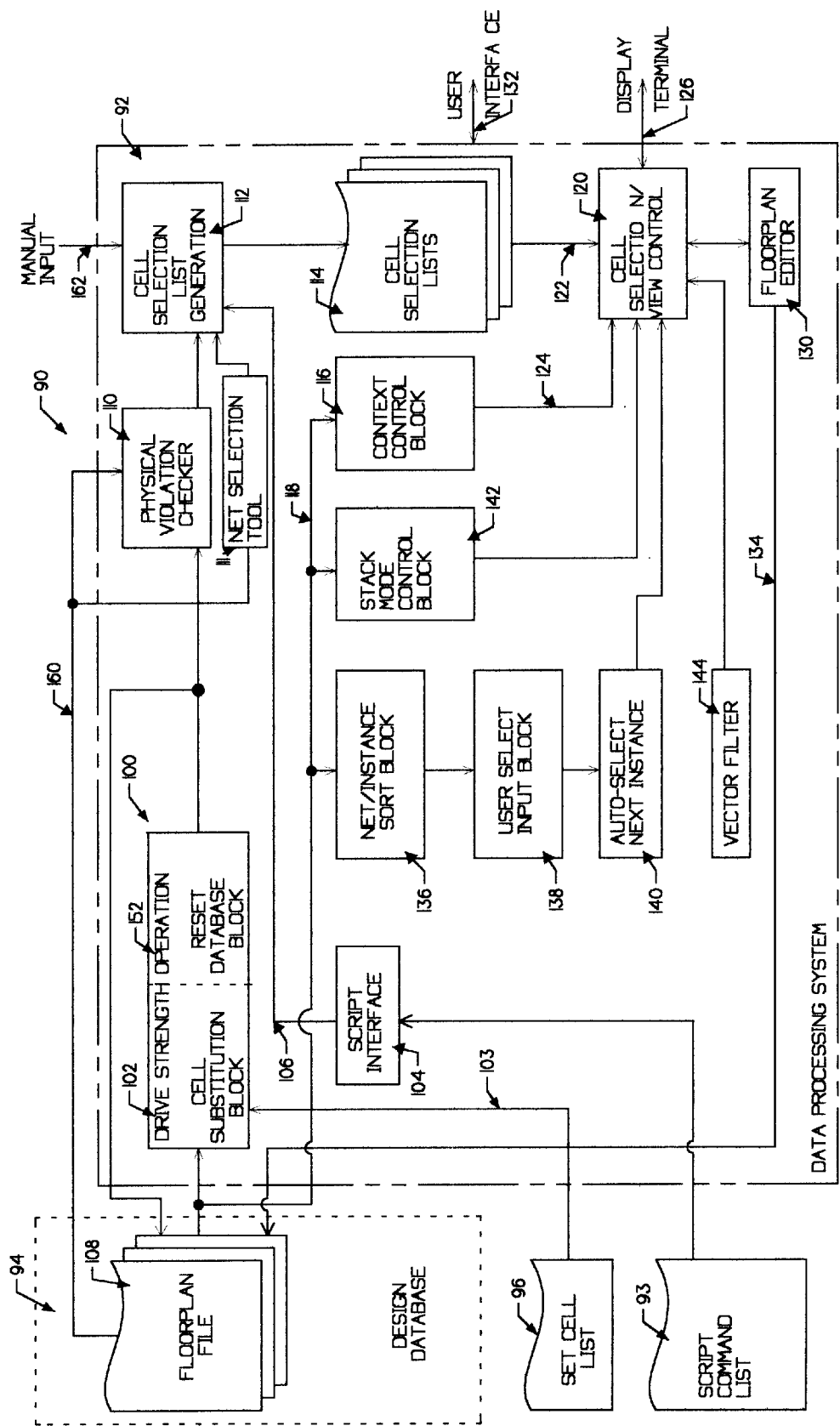
FIG. 5 is a block diagram of a first exemplary data processing system for affecting placement of a circuit design database, in accordance with the present invention.

FIG. 5 is a block diagram of a data processing system 92 for affecting placement of a circuit design in accordance with the present invention. The diagram is generally shown at 90. The data processing system 92 is coupled to a design database 94, a set cell list 96, and a script interface list 93. The design database 94 may include a floorplan file 108. The floorplan file 108 is part of the design database 94, and may include the information and data related to the floorplan, or placement, of the circuit design. In a preferred embodiment, the floorplan file is the only part of the design database 94 that is updated or changed during the floorplanning process.

The generation of the set cell list 96 is described in U.S. patent application Ser. No. 08/598,506, filed Feb. 7, 1996 entitled "Method and Apparatus for Performing Drive Strength Adjust Optimization in a Circuit Design" and U.S. patent application Ser. No. 08/597,931, filed Feb. 7, 1996 entitled "Method and Apparatus for Resolving Conflicts Between Cell Substitution Recommendations Provided by a Drive Strength Adjust Tool", both of which have been incorporated herein by reference. The set cell list 96 contains a list of desired cell substitutions.

The set cell list 96 may be provided to a drive strength operations block 100, via interface 103. Cell substitution block 102 may read the floorplan file 108, and may substitute the specified cells with predetermined cells having a different performance characteristic. In a preferred embodiment, the set cell list 96 identifies certain cells within the current floorplan file 108, and identifies a corresponding cell having a different drive strength for substitution.

After substitution, the cell substitution block 102 writes the results back to the floorplan file 108. A number of previous revisions of floorplan file 108 may be saved, as shown. The floorplan file 108 thus includes the cell substitutions provided by cell substitution block. Because the cell substitution block 102 may only replace the data object within the floorplan file 108, and may not modify the placement of adjacent cells, some of the replacement cells may, for example, overlap adjacent cells or otherwise violate predefined placement rules. This may be particularly true if the replacement cells are physically larger than the original cells. See, for example, U.S. patent application Ser. No. 08/598,506, filed Feb. 7, 1996 entitled "Method and Apparatus for Performing Drive Strength Adjust Optimization in a Circuit Design", and U.S. patent application Ser. No. 08/597,931, filed Feb. 7, 1996 entitled "Method and Apparatus for Resolving Conflicts Between Cell Substitution Recommendations Provided by a Drive Strength Adjust Tool".

To detect physical violations caused by the cell substitution block 102, the floorplan file 108 may be provided to a physical violations checker block 110. The physical violations checker block 110 may detect predetermined physical violations in the floorplan file 108. The physical violations checker 110 may provide the detected physical violations to a cell selection list generation block 112. The cell selection list generation block 112 may generate a list of cells that are involved in the detected physical violations. This may be controlled, at least in part, by script commands provided via interface 106. The resulting list of cells may be formatted into a cell selection list 114. It is contemplated that the cell selection list may also be provided by other input means including manual input interface 162, net selection tool 111, or directly from the script interface 104 via interface 106.

In a preferred embodiment, the cell selection list 114 is a list of cells that are to be sequentially selected by the data processing system, thereby enabling a user to manually correct the detected physical violations. Thus, the cell selection list 114 may be provided to a cell selection/view control block 120. The cell selection/view control block 120 may sequentially select and display each of the cells in the cell selection list 114.

The cell selection/view control block 120 may be coupled to a display terminal via interface 126 and to a floorplan editor 130. The display terminal is used to display the current cell and surrounding cells. In a preferred embodiment, the cell selection/view control block 120 selects the current cell from the cell selection list 114, and zooms in and displays the current cell on the display device. Thereafter, the user may use the floorplan editor 130 via interface 132 to edit the floorplan file to correct the detected physical violation. After each of the cells identified in the cell selection list 114 has been sequentially operated upon by the cell selection/view control block, the user may direct the floorplan editor to store the floorplan file via interface 134. The above design process is also described in U.S. patent application Ser. No. 08/789,024, filed Jan. 27, 1997, entitled "Method and Apparatus for Identifying Physical Errors in a Placement Database" and U.S. patent application Ser. No. 08/789,025, filed Jan. 27, 1997, entitled "Method and Apparatus for Efficiently Viewing a Number of Selected Components Using a Database Editor Tool".

The above method is extremely valuable, particularly since large number of errors may be detected by the physical violations checker block 110. In the past, a circuit designer typically had to manually locate each violation by panning through the design in a floorplanning graphics window. Even when the exact location of a violation was known, navigating to that point could be slow, since the graphics terminal was often manipulating files containing tens of thousands of gates.

It is contemplated that the physical violations checker 110 may read the floorplan file 108 directly via interface 160. This may allow the physical violations checker 110 to detect violations in the floorplan file 108, without first performing a cell substitution. This may be particularly useful when the physical violations checker 110 can detect violations other than those caused by cell substitutions.

In some cases, a cell substitution may cause the performance of the design to decrease or otherwise not have the intended effect. Under these circumstances, it may be desirable to undo the cell substitutions made by cell substitution block 102, and revert back to a previous design iteration. A reset database block 152 may be provided to accomplish this task. The reset database block 152 may read the floorplan file 108, and may reset the floorplan file 108 back to a previous state. The set cell list 96 may then be exported and used by a drive strength adjust tool, as the basis for a new cell substitution. An exemplary drive strength adjust tool is discussed in U.S. patent application Ser. No. 08/598,506, filed on Feb. 7, 1996, and entitled "Method and Apparatus for Performing Drive Strength Adjust Optimization in a Circuit Design".

A number of features may be incorporated into the data processing system to aid in the placement of the design database 94. A context control block 116 may read the floorplan file 108 via interface 118, and may set the current context to a selected hierarchical level. A context is a level of hierarchy within the design database, and often corresponds to a region. The working environment of a corresponding floorplanning tool may be set to the current context. By setting the working environment in this manner, only those cells or regions at one level below the context are displayed in a physical window (for example, a physical window that displays all unplaced cells). This feature may allow a circuit designer to work on a selected portion of the design, without having to sift through the cells and regions that are outside of the current context.

In addition to the above, providing a context as the working environment may make the selection of cells or regions within the context easier, especially if two or more regions overlap. That is, in the present invention, the floorplanning tool may select only those cells and regions that are within the current context. Cells and interconnect outside the current context are still visible. This may be accomplished by enabling for selection only those cells that are associated with the selected context.

It has been recognized that the selection of a region within a floorplanning window can be difficult, particularly when one or more regions overlap. To overcome this limitation, the context control block 116 may include a feature for maneuvering through the circuit design hierarchy, selecting cells or regions, and setting the context accordingly. In a preferred embodiment, this is accomplished by using predetermined up and down hot-keys. This feature may allow a circuit designer to select a predetermined context by selecting a cell or region known to be in a predetermined context, and then hitting an up hot-key to select the predetermined context. This feature may also allow a circuit designer to set the current context to a context lower in the design hierarchy by hitting a down hot-key. Thus, the up and down hot-key feature may allow a circuit designer to easily change the current context to a different hierarchical level from within the floorplanning window.

In contrast to the above, and in prior art placement tools, changing and selecting contexts within the floorplanning window was tedious, especially if regions overlapped. That is, and as indicated above, prior art tools typically cycled through the various overlapping regions until the desired region was finally located by the circuit designer. This was often slow and tedious because the regions were often large, including thousands of gates, and the selection process could involve loading the context information into local memory.

It is contemplated that the data processing system 92 may further include a net/instance sort block 136, a user select block 138, and an auto-select next instance block 140. The net/instance sort block 136 may sort un-placed cells and regions by instance name, and display the results in a physical window. By sorting the un-placed cells in a predetermined way (e.g. by a corresponding net name or instance name), the circuit designer may more easily find a desired cell or region for placement.

In prior floorplanning tools, and as indicated above, when a context was loaded, all of the children cells appeared as a pseudo random list of names in a physical window. Since large contexts often contain thousands of instance names, the physical window provided little utility during the placement process. The circuit designer simply had to scroll through the often lengthy list of instances in an attempt to identify the desired object. It was often more efficient for the circuit designer to determine an instance name by cross-referencing an external listing so that the name could be entered manually prior to placement.

A further advantage of the net/instance sort block 136 is that a circuit designer may more easily define object groups, thereby allowing user defined group operations to more readily be performed. For example, a circuit designer may place all drivers for a vectored net by first performing a net sort, and then placing the first component in the group and specifying a direction for further group placement. The floorplanning tool may then incorporate features that allow the circuit designer to place all remaining cells in the group automatically (see for example, U.S. patent application Ser. No. 08/789,025, filed Jan. 27, 1997, which has been incorporated herein by reference). In the past, this simple operation could require the circuit designer to manually find each instance name, either from some external printout or by panning through the unsorted list within a physical window, and individually place each object.

The user select input block 138 allows a circuit designer to select a desired cell or region from the sorted list of cells provided by net/instance sort block 136. Auto-select next instance block 140 automatically selects the next cell or region in the sorted list of cells, thus allowing the user to sequentially place the cells or regions one after another. It is recognized that this may be particularly useful for placing cells that drive or receive vectored nets.

The data processing system 92 may further include a stack mode control block 142. The stack mode control block 142 may read the design database 94 and detect which groups of cells or regions have been defined as a stack. In a preferred embodiment, the design database 94 includes information which identifies selected cells as belonging to a particular stack. Once the stacks are identified, the stack mode control block 142 may allow the user to perform group operations on the stack. For example, all cells in the stack may be moved by simply moving the stack. Further, all cells in the stack may be placed by placing a first one of the cells and indicating a placement direction and spacing for the remaining cells of the stack. The stack mode control block 142 may automatically place the remaining cells in the specified direction and at the specified spacing.

Finally, data processing system 92 may include a vector filter block 144. Vectored filter block 144 may be coupled to the cell selection/view control block 120. Vector filter block 144 may allow a user to view only those vectored nets that are wider than a predetermined threshold, narrower than a predetermined threshold, or fall within a predetermined range. Vector filter block may also allow the user to display only those nets that are driven or received by selected objects, display estimated flywires to yet un-placed cells, and/or selectively view only those nets that cross a pre-defined hierarchical boundary. These features may reduce the visual complexity of the circuit design on the display device, and may allow the circuit designer to more effectively analyze vectored net paths.

Figure 6:
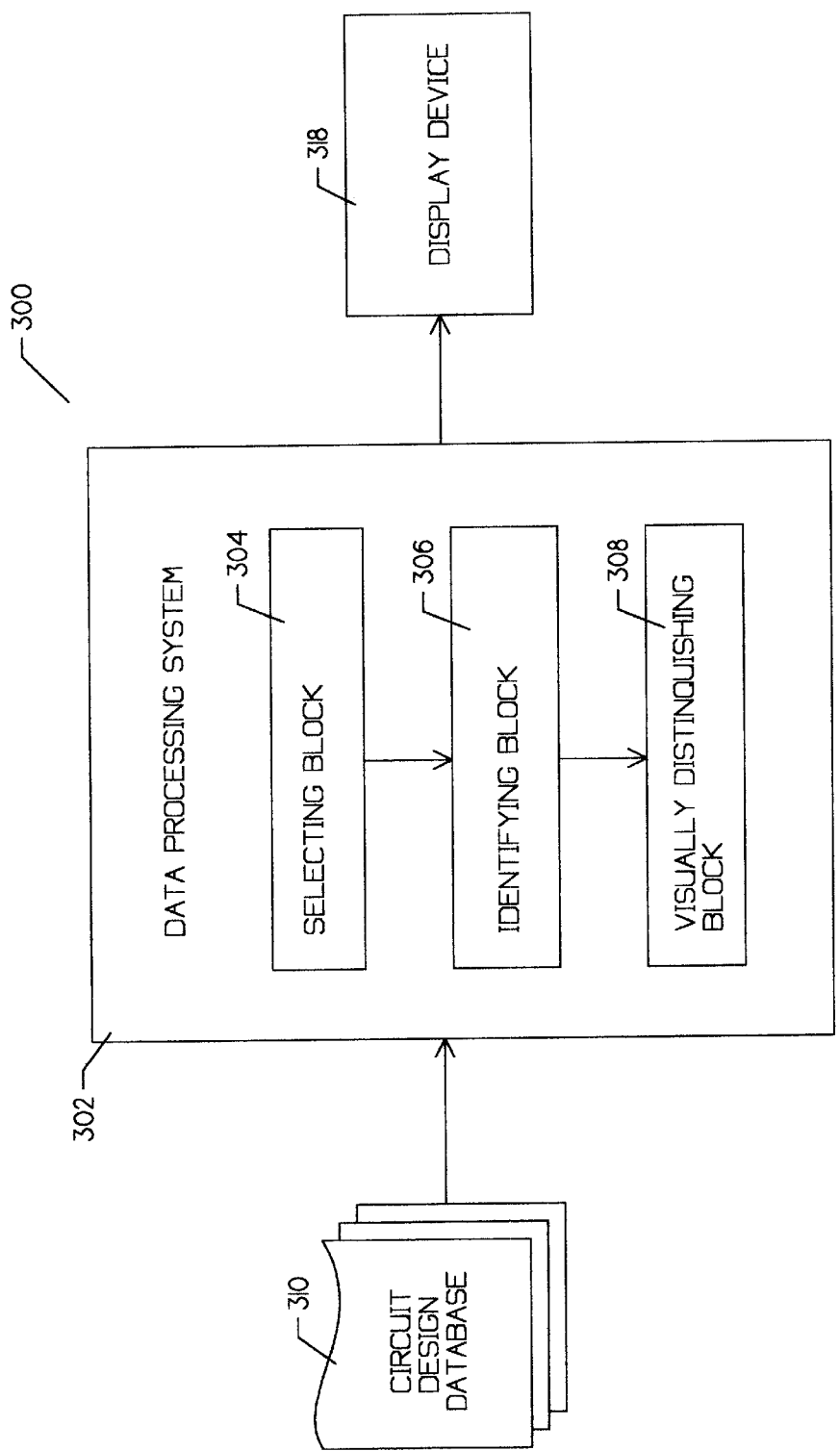
FIG. 6 is a block diagram of a data processing system, in accordance with the present invention.

FIG. 6 is a block diagram of a data processing system, in accordance with the present invention. The diagram is generally shown at 300. The data processing system 302 includes a selecting block 304, an identifying block 306 and a visually distinguishing block 308.

The data processing system may read a circuit design database 310 as shown, wherein the circuit design database includes a number of circuit objects, a number of vectored nets and a number of scalar nets. The selecting block 304 may select selected ones of the number of circuit objects. In a preferred embodiment, the selecting block 304 is controlled by a user. The identifying block 306 may identify which of the number of vectored nets are driven or received by the selected placed circuit objects, thereby resulting in a number of identified vectored nets. Finally, the visually distinguishing block 308 may visually distinguish the identified vectored nets from the remaining number of vectored nets and scalar nets on a display device 318.

In an exemplary embodiment, the circuit design database 310 stores, for each of the selected circuit objects, a net I/O list which identifies the vectored nets and scalar nets that are received thereby. The identifying block 306 may then identify which of the number of vectored nets are received by the selected placed circuit objects by examining the corresponding net I/O list.

The visually distinguishing block 308 may visually distinguish the identified nets from the remaining vectored and scalar nets in any number of ways. For example, the identified nets may be displayed in a different color, in a different form like a highlighted form, or any other visually distinguishing way.

Figure 7:
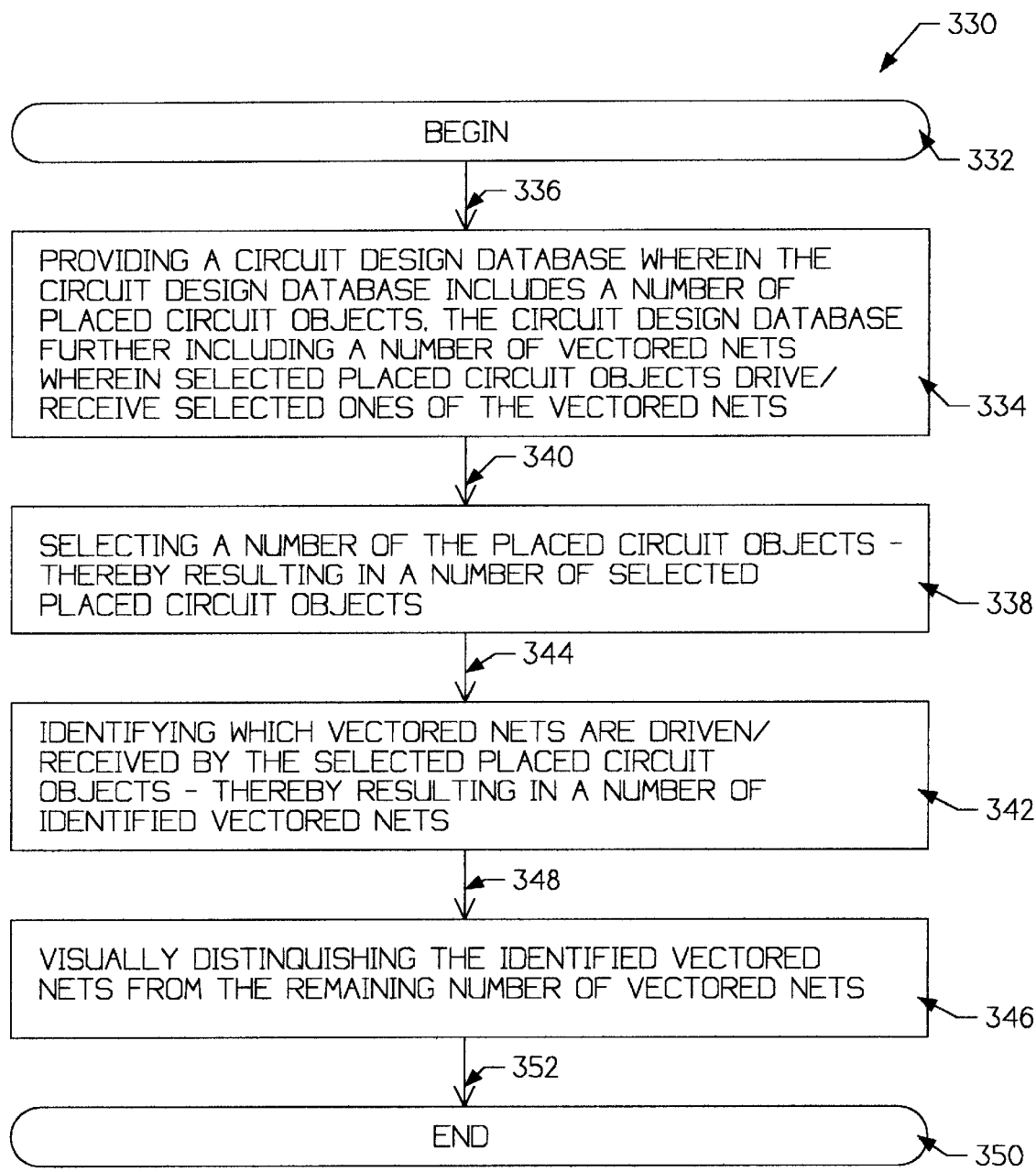
FIG. 7 is a flow diagram of a first exemplary method of the present invention.

FIG. 7 is a flow diagram of a first exemplary method of the present invention. The diagram is generally shown at 330, and is entered at element 332. Control is then passed to element 334 via interface 336. Element 334 provides a circuit design database that includes a number of placed circuit objects. The circuit design database further includes a number of vectored nets, wherein selected placed circuit objects drive or receive selected ones of the vector nets. Control is then passed to element 338 via interface 340. Element 338 selects a number of objects out of all the placed objects, thereby resulting in a number of selected placed circuit objects. Control is then passed to element 342 via interface 344. Element 342 identifies all the vectored nets are driven or received by the selected placed circuit objects, thereby resulting in a number of identified vectored nets. Control is then passed to element 346 via interface 348. Element 346 visually distinguishes the identified vector nets from the remaining number of vectored nets. Control is then passed to element 350 via interface 352, wherein the algorithm is exited.

Figure 8B:
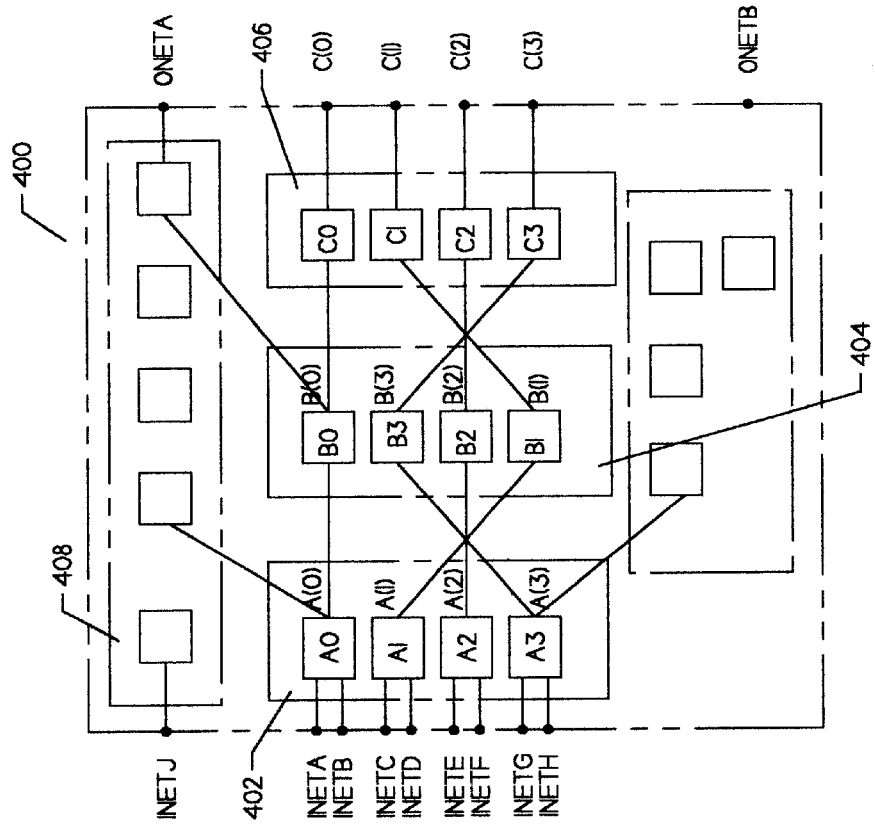
FIG. 8B illustrates a display of a placement tool in accordance with the present invention, wherein only the nets driven or received by instances A0–A3, B0–B3, and C0–C3 are displayed by the placement tool.
Figure 8A:
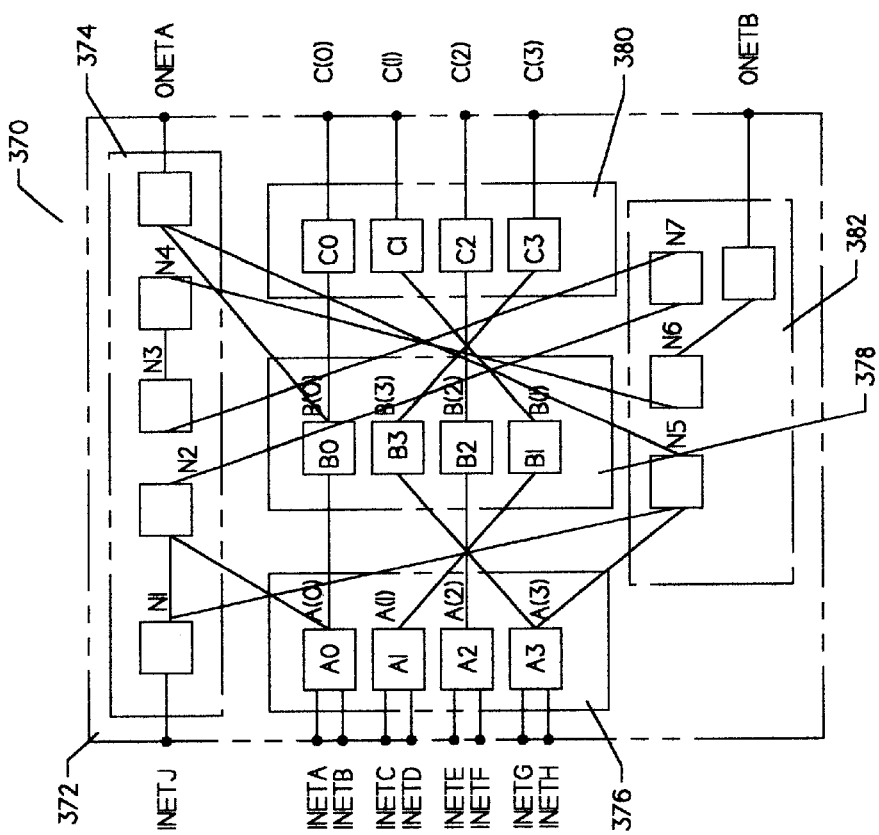
FIG. 8A illustrates a display of a placement tool showing an exemplary circuit design having a number of placed objects, and a number of nets extending therebetween.

FIG. 8A illustrates a display of a placement tool showing an exemplary circuit design having a number of placed objects, and a number of nets extending therebetween. The number of nets are shown as fly-wires, displaying a direct connecting between two or more circuit objects.

A top level region is shown at 372, and includes lower level regions 374, 376, 378, 380 and 382. In the present example, each of the objects shown, for example objects A0–A3, have been placed by a circuit designer. The placement tool may then display the interconnections between the objects using flywires as shown.

A limitation of this display is that all nets are displayed. This may create a "rats-nest" of flywires, making it difficult for a circuit designer to evaluate the desirability of the current object placement. It should be recognized that the circuit design shown in FIG. 8A is only illustrative, and that typical placement files may be much more complex containing many more placed objects and hundreds or thousands of flywires.

FIG. 8B illustrates a display of a placement tool in accordance with the present invention, wherein only the nets driven or received by instances A0–A3, B0–B3, and C0–C3 are displayed by the placement tool. To aid the circuit designer in creating and evaluating a placement file, the present invention contemplates displaying only selected nets, thereby reducing the complexity of the "rats nest" created by the flywires. In the present example, the placement tool may allow the circuit designer to select a number of the placed objects, and then display only those nets (flywires) that are either driven or received by the selected objects.

Referring specifically to FIG. 8B, it may be desirable to evaluate the primary data path formed by objects A0–A3, B0–B3 and C0–C3. As such, the circuit designer may select the objects A0–A3, B0–B3 and C0–C3. In the exemplary embodiment, the placement tool may then only display the nets that are driven or received by these objects. In the present example, nets INETA-INETJ, A(0–3), B(0–3), C(0–3) and ONETA-ONETB are displayed. Note that nets N1–N7 are not displayed (see FIG. 8A). As can readily be seen this may substantially decrease the visual complexity of the circuit design, enabling the circuit designer to more readily focus on the data path of interest.

The circuit designer may recognize that the nets A(1) and A(3) must cross over each other, as well as A(2), to reach objects B(1) and B(3), respectively. Further, nets B(1) and B(3) must cross over each other, as well as B(2), to reach objects C(1) and C(3), respectively. This may not be an optimum placement solution.

Figure 8D:
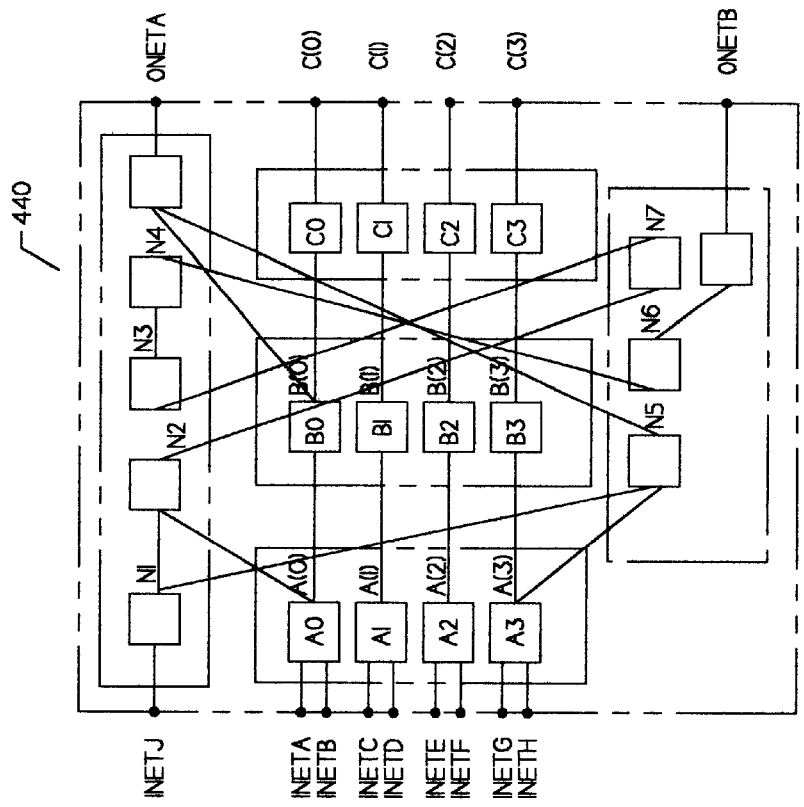
FIG. 8D illustrates the display of the placement tool for the circuit design shown in FIG. 8C, with all nets displayed.
Figure 8C:
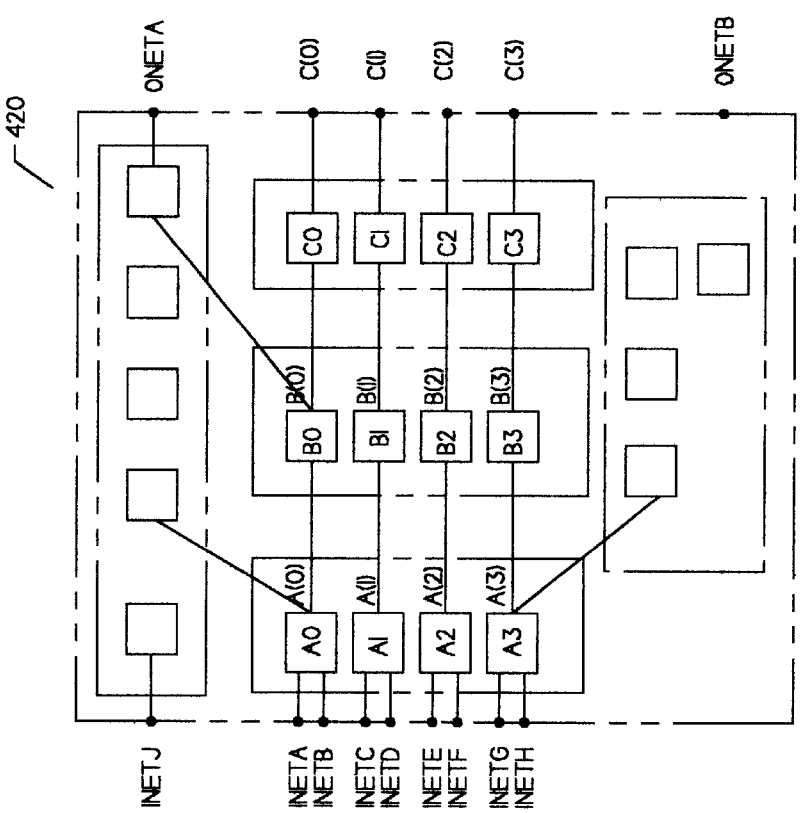
FIG. 8C illustrates the circuit design shown in FIG. 8B, with a modified placement of A0–A3, B0–B3, and C0–C3 to provide a more optimum data flow.

FIG. 8C illustrates the circuit design shown in FIG. 8B, with a modified placement of A0–A3, B0–B3, and C0–C3 to provide a more optimum solution. The placement of objects B1 and B3 have been reversed. As can readily be seen, this provides a direct linear connection between A0–A3 and B0–B3, and between B0–B3 and C0–C3. This may be a better placement solution.

FIG. 8D illustrates the display of the placement tool for the circuit design shown in FIG. 8C, with all nets displayed. After the circuit designer is satisfied with the placement of the objects associated with the data path formed by objects A0–A3, B0–B3 and C0–C3, the circuit designer may again display all nets (flywires), as shown in FIG. 8D.

Figure 9:
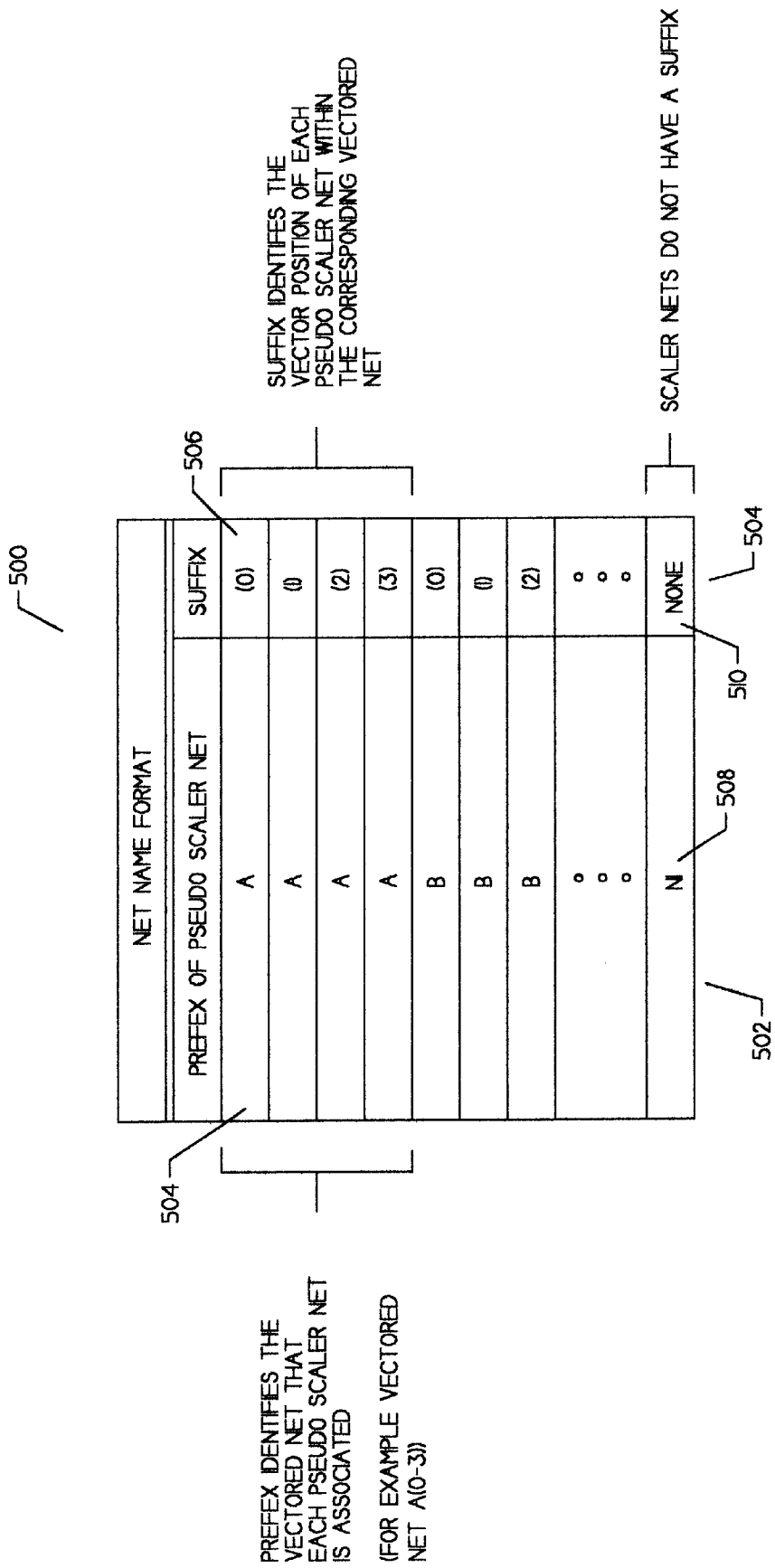
FIG. 9 is a table showing an exemplary net name format for vectored nets within a circuit design.

FIG. 9 is a table showing an exemplary net name format for vectored nets within a circuit design. In a preferred embodiment of the present invention, only vectored nets can be selectively viewed. However, it should be recognized that the present invention may be applied to any net within a circuit design database, including scalar nets.

Since only vectored nets are contemplated in a preferred embodiment of the present invention, it may be desirable to distinguish between vectored nets and scalar nets. Vectored nets are typically represented as a grouping of a number of pseudo scalar nets. To determine if a net is a scalar net or a pseudo scalar net, it is contemplated that each of the pseudo scalar nets may include a vectored net identifier indicating the association with a vectored net. In an exemplary embodiment, the vectored net identifier may be a predefined net name format, wherein the net name format may include a prefix which is identical for all pseudo scalar nets that are associated with a particular vectored net. The net name format may further include a suffix that identifies a vector position of the corresponding pseudo scalar net within the particular vectored net.

This net name format is shown generally at 500. The prefix for each of the pseudo scalar nets is shown in column 502, and the suffix is shown in column 504. The first four entries in table 500 correspond to the vectored net A(0–3). The first pseudo scalar net A(0) is shown as the first entry. Each of the pseudo scalar nets associated with A(0–3) have a common prefix "A", as shown at 504. Further, each pseudo scalar net has a suffix, for example suffix "(0)" as shown at 506, that identifies the bit position of the corresponding pseudo scalar net within the vectored net. Note that strictly scalar nets do not have a suffix. For example, the scalar net "N1" as shown at 508 does not have a suffix as shown at 510. By using this format, the database editor tool may distinguish by pattern recognition between those nets that are associated with a vectored net, and those nets that are strictly scalar nets.

Figure 10:
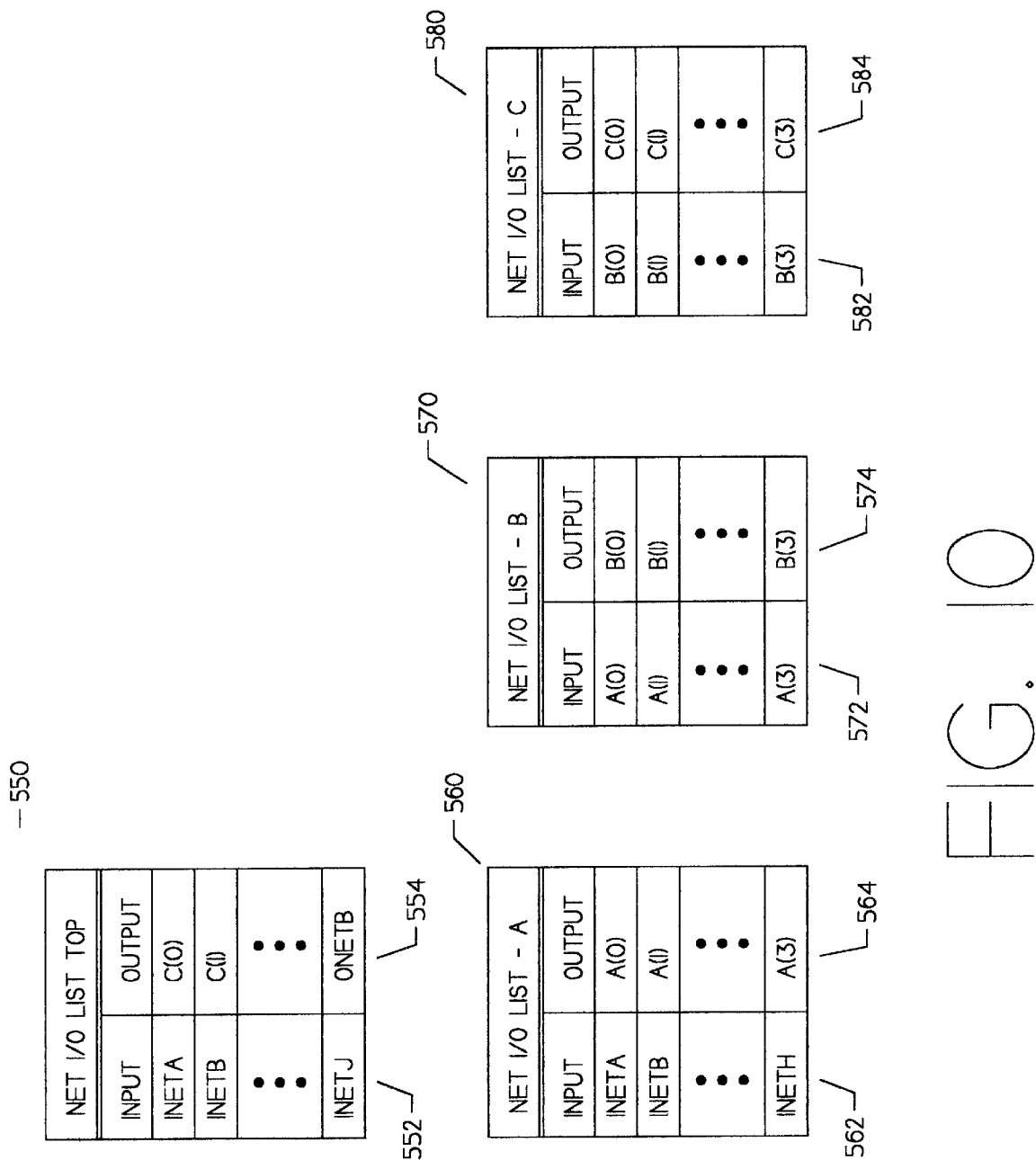
FIG. 10 illustrates exemplary I/O lists of net names for each region of the circuit design shown in FIGS. 8A–8D.

FIG. 10 illustrates exemplary I/O lists of net names for the regions shown in FIGS. 8A–8D. The I/O list for the top level region 372 (see FIG. 8A) is shown at 550. The I/O list may separately identify the nets that are inputs and outputs to the corresponding region. For example, the input nets of the top level region 372 are shown in column 552, and the output nets are shown in column 554. Similarly, the I/O list for region-A 376 (see FIG. 8A) is shown at 560. the input nets of region-A 376 are shown in column 562, and the output nets are shown in column 564. The I/O list for region-B 378 is shown at 570. the input nets of region-B 378 are shown in column 572, and the output nets are shown in column 574. Finally, the I/O list for region-C 380 is shown at 580. the input nets of region-A 380 are shown in column 582, and the output nets are shown in column 584. It is contemplated that an I/O list may be stored in the circuit design database for each of the regions in the circuit design.

The I/O lists may be used by a database editor tool to identify which nets are driven or received by a particular object. For example, the I/O list 570 identifies A(0), A(1), A(2) and A(3) as nets that are received by region-B 378. In addition the I/O list 570 identifies B(0), B(1), B(2) and B(3) as nets that are driven by region-B 378. Thus, when region-B 378 is selected, the database editor tool may display nets A(0–3) and B(0–3). It is contemplated that each object within region-B, for example region B0 371, may have an I/O list associated therewith. That is, each region or object, regardless of the level of hierarchy within the design, may include an I/O list. Thus, depending on the region that is selected, the appropriate I/O list may be used to determine the nets that are driven and/or received by that region.

Rather than storing an I/O list for each region, it is contemplated that the database editor tool may read selected properties that may be associated with each region. That is, each region may have a number of properties associated therewith that may identify the input and output nets. The properties may be stored as database objects, and the database editor tool may query the database objects to determine the input and output nets for a particular region.

Figure 11:
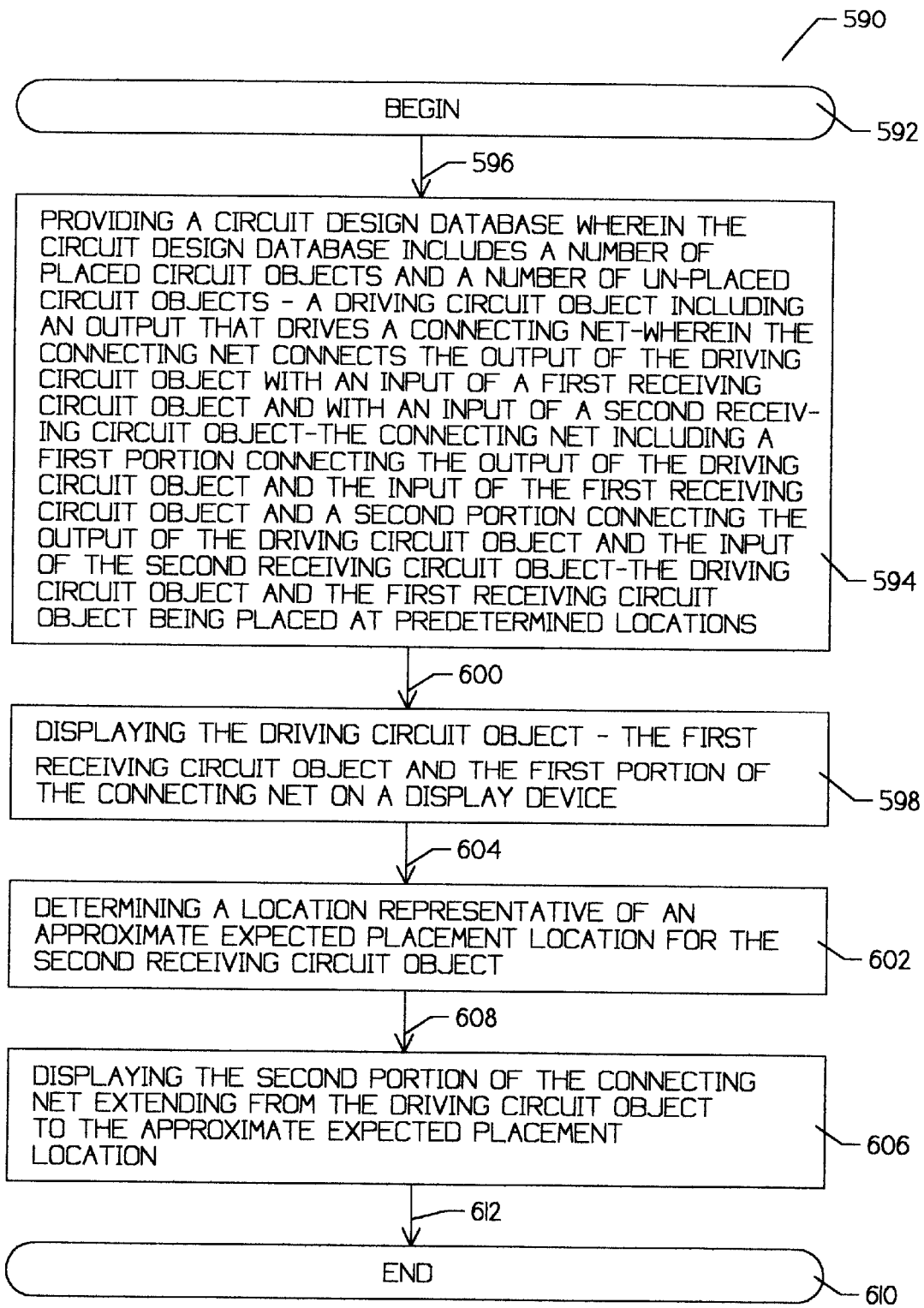
FIG. 11 is a flow diagram of a second exemplary method of the present invention.

FIG. 11 is a flow diagram of a second exemplary method of the present invention. The algorithm is generally shown at 590, and is entered at element 592. Control is passed to element 594 via interface 596. Element 594 provides a circuit design database, wherein the circuit design database includes a number of placed circuit objects and a number of unplaced circuit objects. A driving circuit object, including an output, drives a connecting net, wherein the connecting net connects the output of the driving circuit object with an input of a first receiving circuit object. The connecting net may further connect the output of the driving circuit object with a second receiving circuit object. It is contemplated that the connecting net may include a first portion connecting the output of the driving circuit object and the input of the first receiving circuit object, and a second portion that connects the output of the driving circuit object and the input of the second receiving circuit object. In the present example, the driving circuit object and the first receiving circuit object are placed at predetermined locations. Control is passed to element 598 via interface 600. Element 598 displays the driving circuit object, the first receiving circuit object and the first portion of the connecting net on a display device. Control is then passed to element 602 via interface 604. Element 602 determines a location representative of an approximate expected placement location for the second receiving circuit object. Control is then passed to element 606 via interface 608. Element 606 displays the second portion of the connecting net extending from the driving circuit object to the approximate expected placement location. Control is then passed to element 610 via interface 612, wherein the algorithm is exited.

It is contemplated that some or all of the circuit objects may not yet be placed. For each un-placed object, an approximate placement is determined. Thereafter, any connecting nets are broken into the desired number of net objects. Each net object then has a location and can be displayed, as described below.

Figure 12:
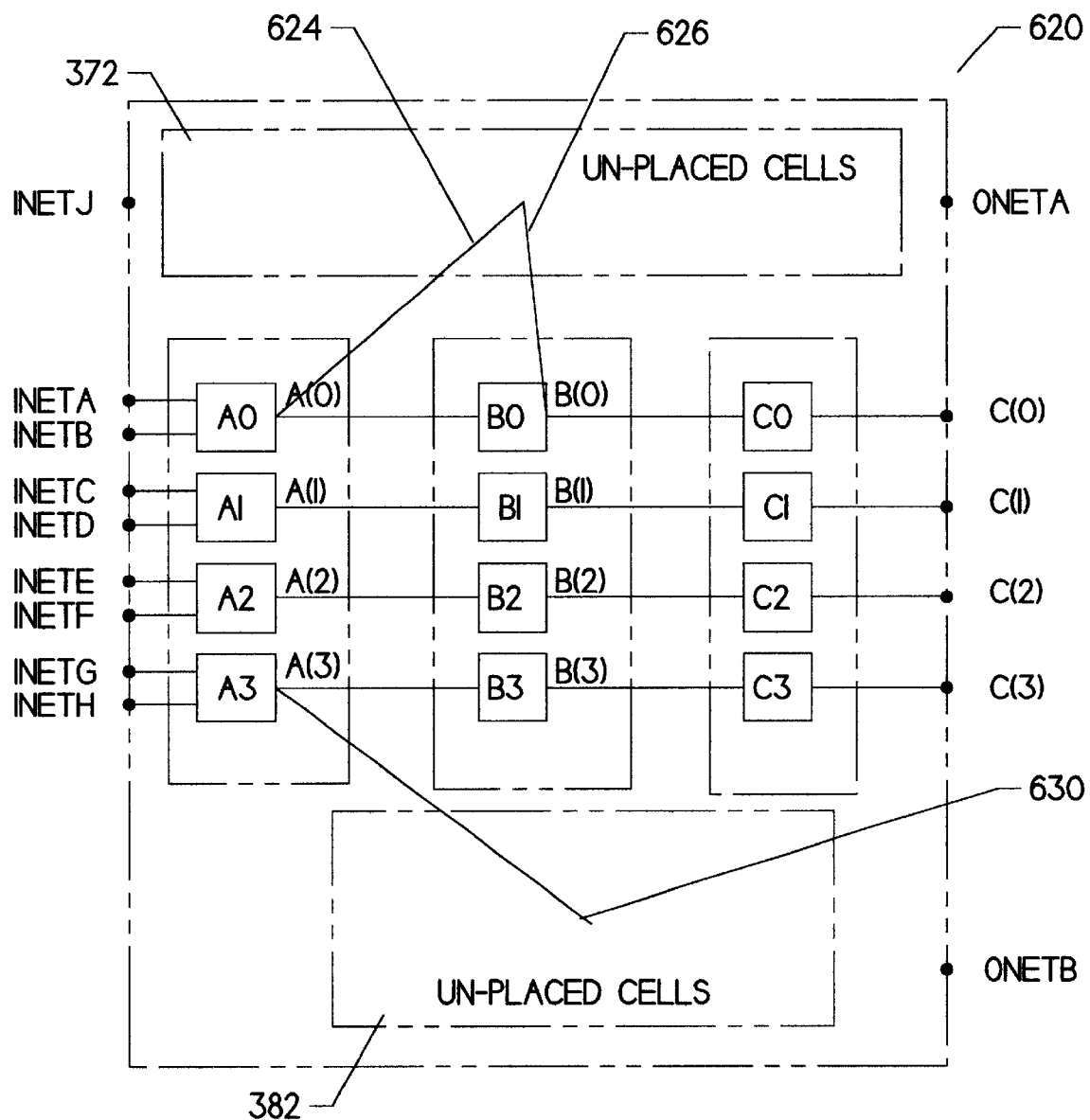
FIG. 12 illustrates the display of fly-wires that are associated with un-placed cells, in accordance with the present invention.

FIG. 12 illustrates the display of fly-wires that are associated with un-placed cells, in accordance with the present invention. This feature allows the circuit designer to display not only the portion of the nets that extend between selected objects, but estimates the position of the portion of the nets that extend to yet un-placed objects.

For example, in the illustrative embodiment shown in FIG. 12, the objects A0–A3, B0–B3 and C0–C3 are placed and selected. Further, regions 372 and 382 are placed, but do not yet have their lower level cells placed therein. As can be seen in FIG. 8A, object A0 connects to a first lower level object in region 372. Likewise object B0 connects to a second lower level object in region 372. Thus, in accordance with the present invention, the placement tool may estimate the approximate location of the first and second lower level objects, and may display a flywire thereto. In a preferred embodiment, the estimated approximate location is the center of the region containing the first and second lower level objects.

Thus, if a first placed object drives a net, and a second placed object receive the net, the present invention may display a flywire between the first object and the second object (see FIGS. 8A–8D). However, if a third un-placed object also receive the net, the present invention may also display a flywire between the first object and an estimated location for the third un-placed object. This may help identify potential areas of high routing congestion and/or may suggest to a circuit designer a desirable placement location for the third un-placed object.

Figure 13:
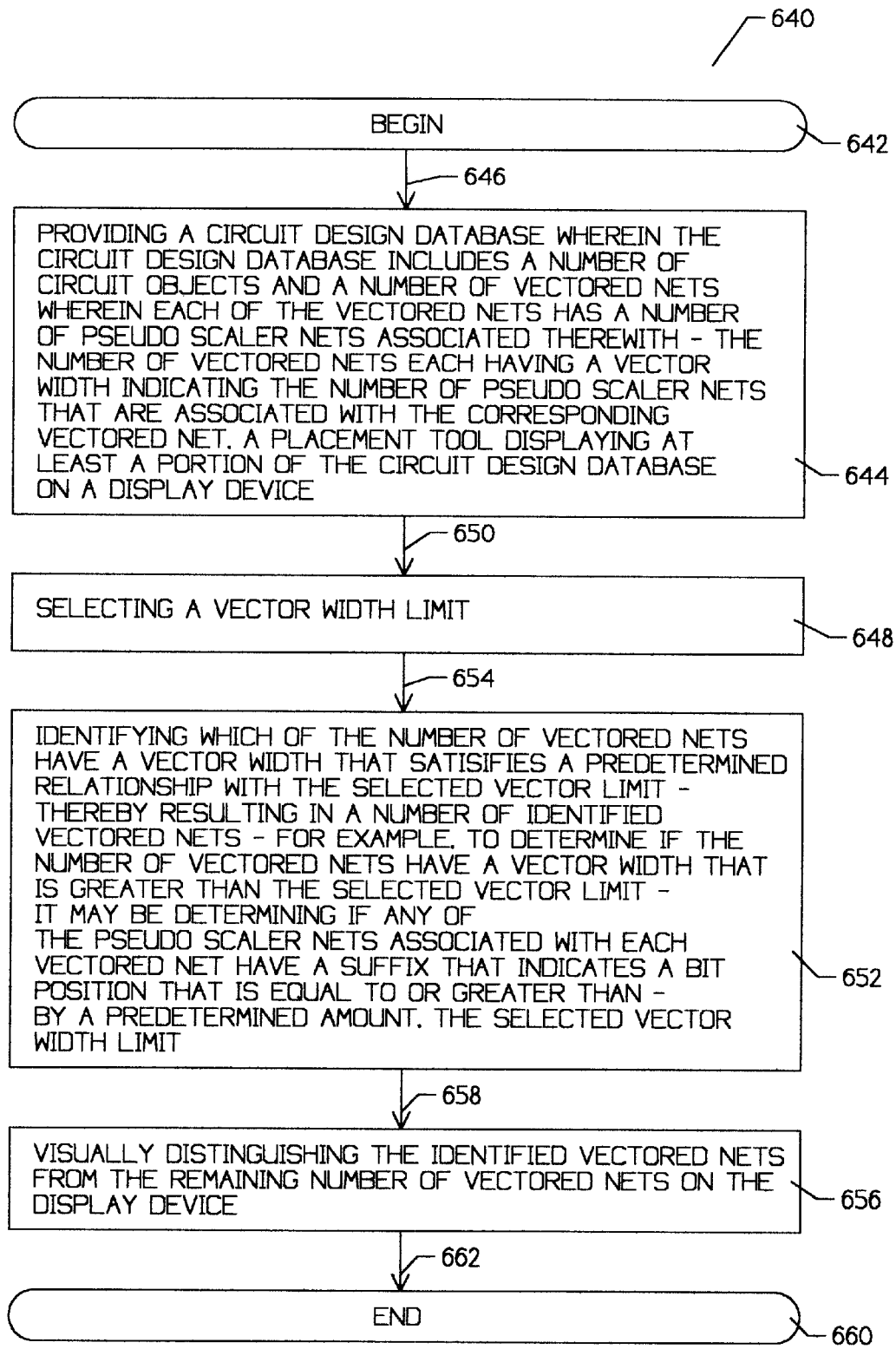
FIG. 13 is a flow diagram of a third exemplary method of the present invention.

FIG. 13 is a flow diagram of a third exemplary method of the present invention. This diagram illustrates a feature which may allow a circuit designer to display only those vectored nets that have a predefined bit width. The algorithm is generally shown at 640, and is entered at element 642. Control is passed to element 644 via interface 646. Element 644 provides a circuit design database that includes a number of circuit objects and a number of vectored nets. Each of the vectored nets may have a number of pseudo scalar nets associated therewith, and may have a vector width indicating the number of pseudo scalar nets. Control is passed to element 648 via interface 650. Element 648 selects a vector width limit. Control is then passed to element 652 via interface 654. Element 652 identifies which of the number of vectored nets have a vector width that satisfies a predetermined relationship with the selected vector limit. For example, to determine if the number of vectored nets have a vector width that is greater than the selected vector limit, it may be determined if any of the pseudo scalar nets associated with each vectored net have a suffix that indicates a bit position that is equal to or greater than the selected vector width limit. While bit position in one valid criteria, it is contemplated that the number of pseudo nets within a vector can also be used since the bit position may be arbitrary in that the vector does not have to start at bit position 1. This may result in a number of identified vectored nets. Control is passed to element 656 via interface 658. Element 656 visually distinguishes the identified vectored nets from the remaining number of vectored nets on a display device. Control is then passed to element 660 via interface 662, wherein the algorithm is exited.

Figure 14:
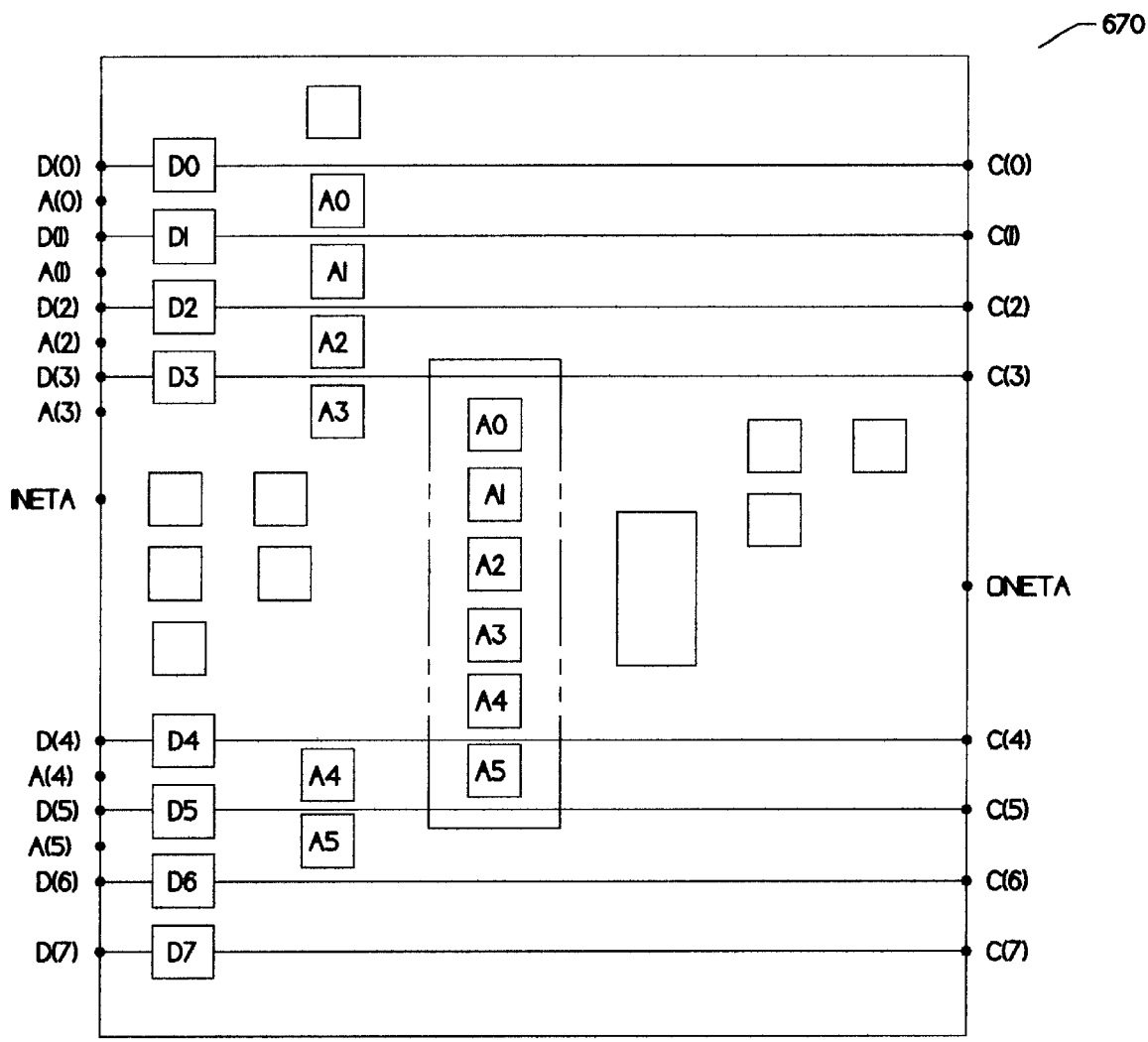
FIG. 14 illustrates a display of a placement tool in accordance with the present invention, wherein a filter is used to display only those nets that have a bit width that is greater than seven bits.

FIG. 14 illustrates a display of a placement tool in accordance with the present invention, wherein a filter is used to display only those nets that have a bit width that is greater than seven bits. It is assumed that the circuit designer has entered a vector width limit of seven bits. In the illustrative embodiment, the only vectored nets having a vectored width of greater than seven bits are D(0–7) and C(0–7). Thus, these are the only vectored nets displayed on the display device, as shown.

This feature contemplates providing a vector filter which may permit only vectored nets with a selected bus width range to be viewed. That is, the circuit designer may specify a bus width range, and a vector filter may then filter those nets that fall outside the specified bus width. The resulting nets may then be displayed on a display device. This feature may allow a circuit designer to, for example, display only those nets within a circuit design that are directly associated with a selected data or address path. This may allow the circuit designer to more readily analyze the placement of the objects that are associated with the selected data or address path.

Figure 15:
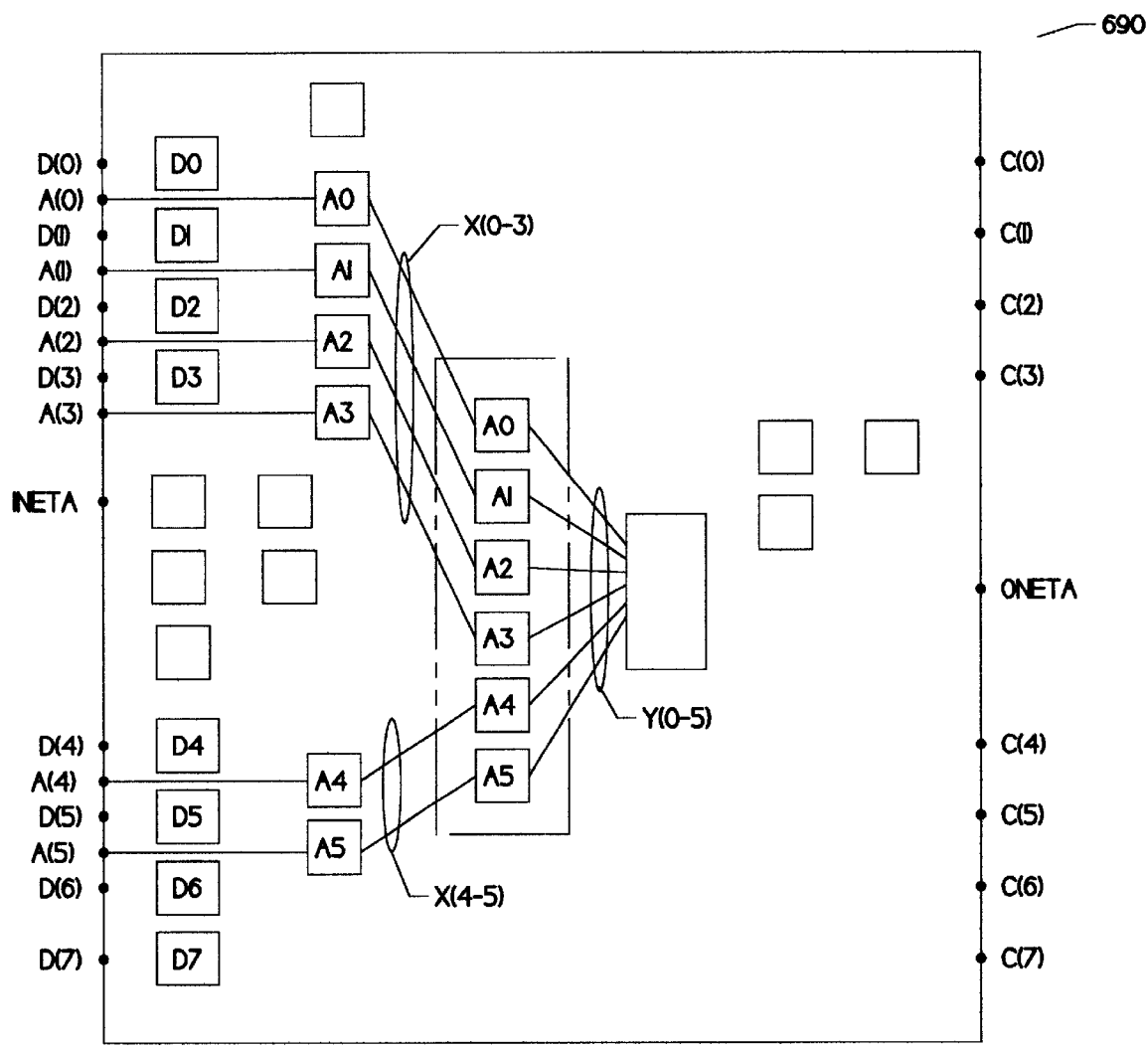
FIG. 15 illustrates a display of a placement tool in accordance with the present invention, wherein a filter is used to display only those nets that have a bit width that is less than seven bits.

FIG. 15 illustrates a display of a placement tool in accordance with the present invention, wherein a filter is used to display only those nets that have a bit width that is less than seven bits. It is assumed that the circuit designer has entered a vector width range of less than seven bits. In the illustrative embodiment, the only vectored nets having a vectored width of less than seven bits are A(0–5), X(0–5) and Y(0–5). Thus, these are the only vectored nets displayed on the display device, as shown. As can readily be seen, this feature may allow the circuit designer to more readily analyze the placement of the objects that are associated with the selected data or address path.

Figure 16:
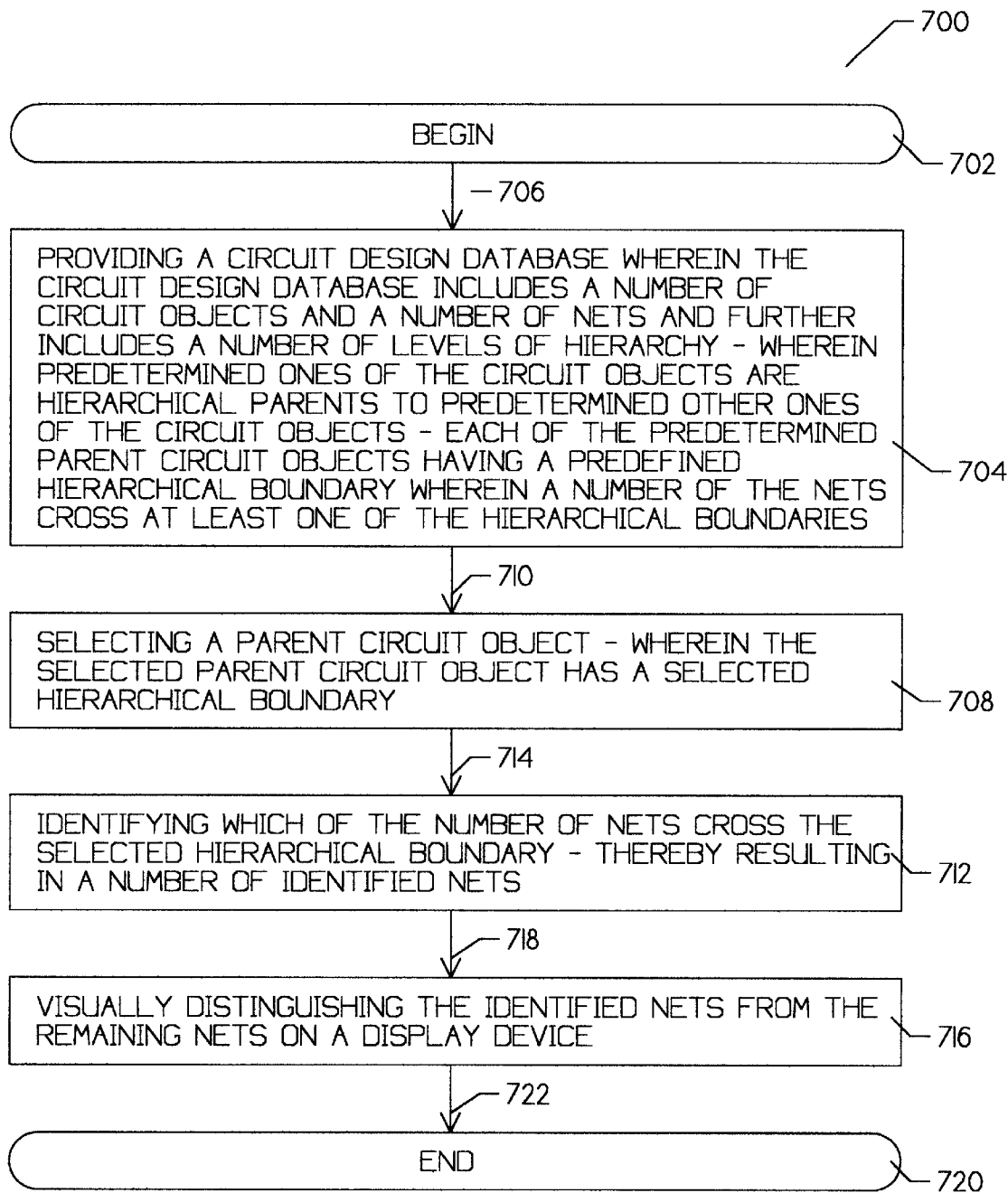
FIG. 16 is a flow diagram of a fourth exemplary method of the present invention.

FIG. 16 is a flow diagram of a fourth exemplary method of the present invention. This method illustrates another feature of the present invention, which providing a means for selectively viewing only those nets that cross a predefined hierarchical boundary within the circuit design database. This feature may allow a circuit designer to more readily identify those nets that enter or exit a particular region. Further, this feature may enable a circuit designer to more readily trace a net through the circuit design hierarchy.

The algorithm is generally shown at 700, and is entered at element 702. Control is passed to element 704 via interface 706. Element 704 provides a circuit design database that includes a number of circuit objects and a number of nets. The circuit design database further includes a number of levels of hierarchy, wherein predetermined ones of the circuit objects are hierarchical parents to predetermined other ones of the circuit objects. Each of the parent circuit objects may have a predefined hierarchical boundary, and a number of nets may cross the hierarchical boundary.

Control is passed to element 708 via interface 710. Element 708 selects one of the parent circuit objects. Element 712 then identifies which of the number of nets cross the hierarchical boundary of the selected parent circuit object. This is accomplished by evaluating the nets of each child of the selected parent object. If the net connected to that child connects to another object which is not a child of the parent object, the net crosses the parent object boundary. Element 716 then visually distinguishes the identified nets from the remaining nets on a display device. Finally, control is passed to element 720 via interface 722, wherein the algorithm is exited.

Figure 17:
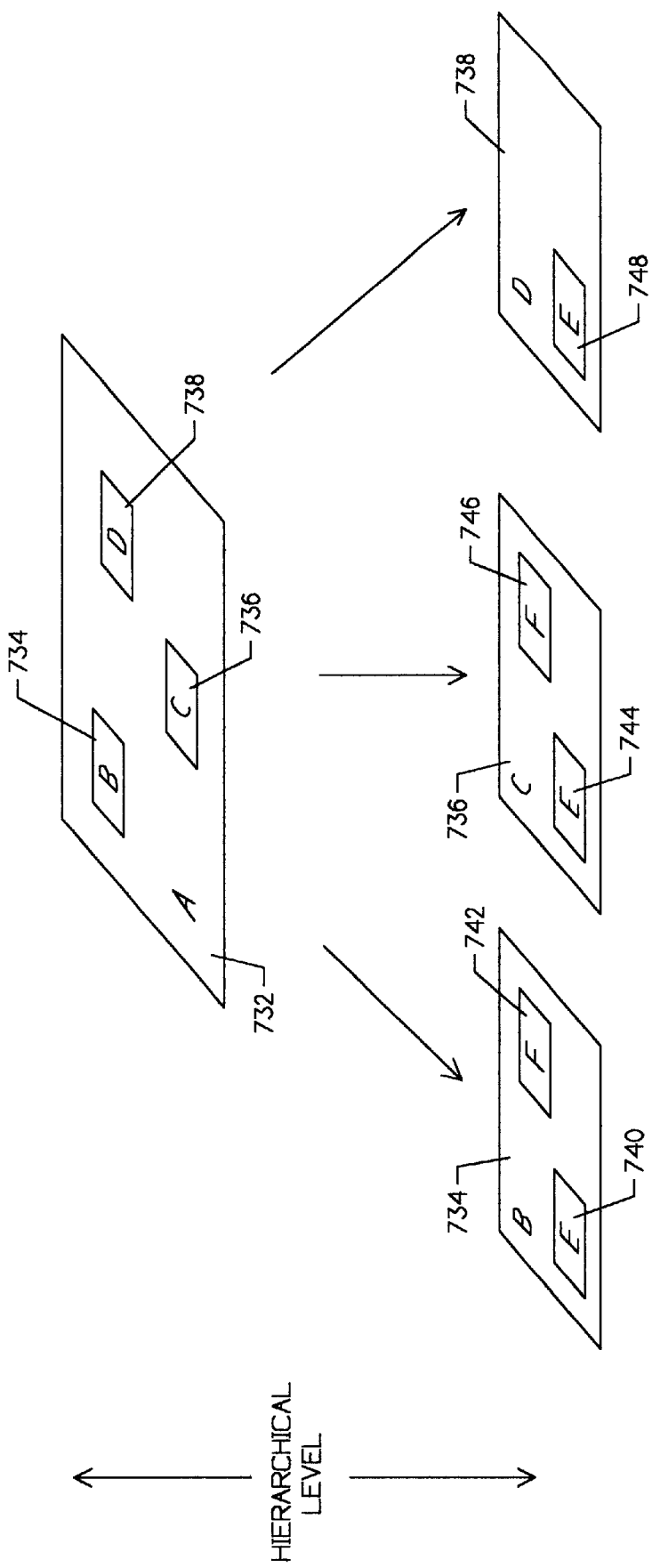
FIG. 17 is a block diagram showing a number of context environments for an illustrative hierarchical circuit design.

FIG. 17 is a block diagram showing a number of hierarchical levels within a circuit design. Region-A 732 may be a parent circuit object, and may include region-B 734, region-C 736 and region-D 738 as children objects.

Similarly, region-B 734 may be a parent object, and may include region-E 740 and region-F 742 as children objects. Region-C 736 may be a parent object, and may include region-E 744 and region-F 746 as children objects. Finally, region-D may be a parent object, and may include region-E 748 as a child object. Thus, any of regions A, B, C, or D may be selected as a parent object, and each has a hierarchical boundary associated therewith.

Figure 18:
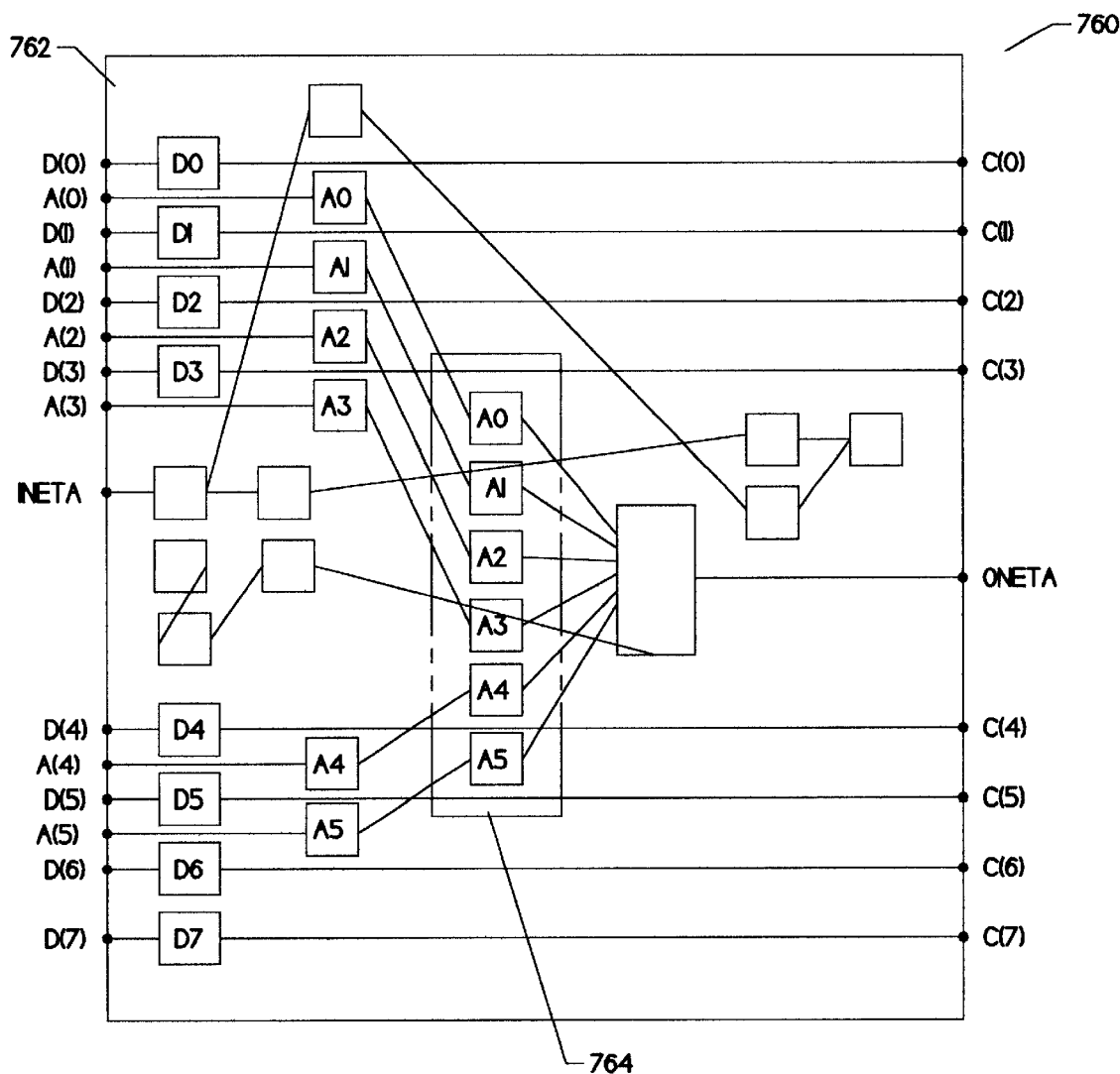
FIG. 18 illustrates a display of a placement tool in accordance with the present invention, showing a number of nets that cross a number of hierarchical boundaries.
Figure 19:
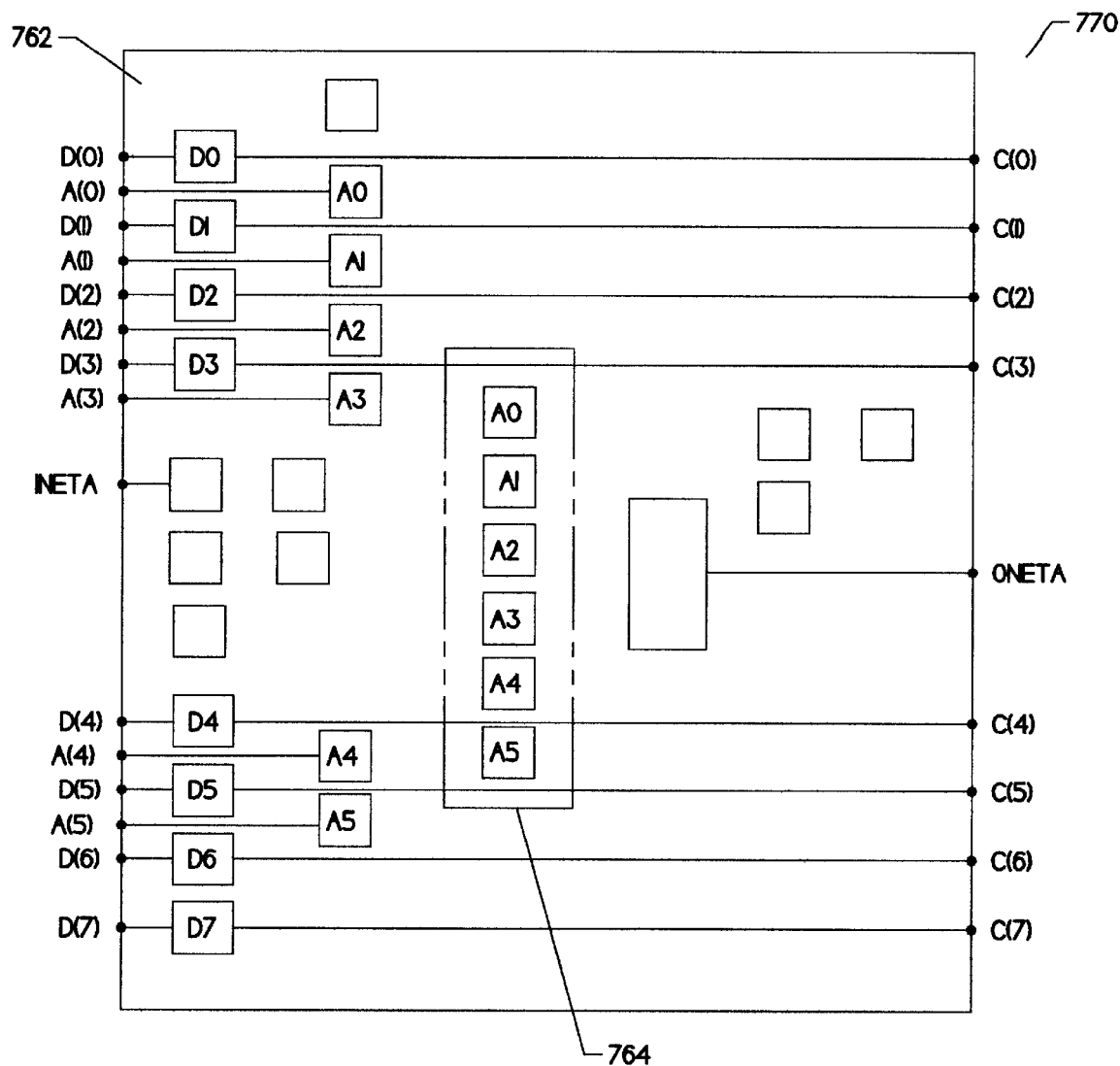
FIG. 19 illustrates a display of a placement tool in accordance with the present invention, wherein only the nets that cross the top hierarchical boundary are displayed.
Figure 20:
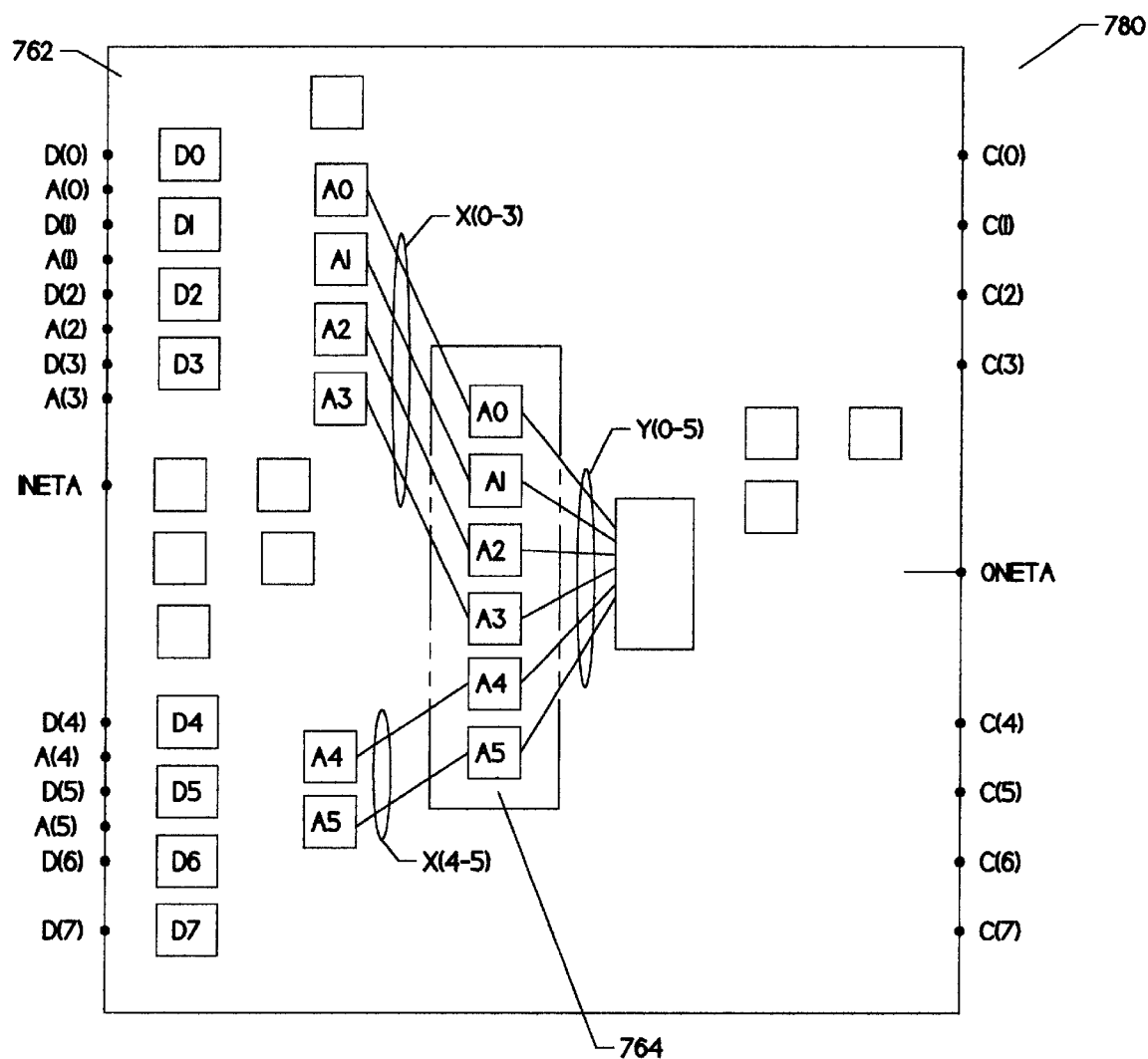
FIG. 20 illustrates a display of a placement tool in accordance with the present invention, wherein only the nets that cross the hierarchical boundary of region "A" are displayed.

FIG. 18 illustrates a display of a placement tool in accordance with the present invention, showing a number of nets that cross a number of hierarchical boundaries. A top hierarchical region 762 is shown, having a child hierarchical region 764 therein. FIG. 19 illustrates that when the top hierarchical region 762 is selected, only those nets that cross the corresponding hierarchical boundary are displayed. That is, only nets A(0–5), D(0–7), INETA, C(0–7), and ONETA are displayed FIG. 20 illustrates that when the child hierarchical region 764 is selected, only those nets that cross the corresponding hierarchical boundary are displayed. That is, only nets X(0–5) and Y(0—5) are displayed. This feature may allow a circuit designer to more readily identify those nets that enter or exit a particular region. Further, this feature may enable a circuit designer to more readily trace a net through the circuit design hierarchy.

Having thus described the preferred embodiments of the present invention, those of skill in the art will readily appreciate that the teachings found herein may be applied to yet other embodiments within the scope of the claims hereto attached.

We claim:

1. A method for viewing vectored nets within a circuit design database using a placement tool, the circuit design database including a number of circuit objects, a number of vectored nets and a number of scalar nets, each vectored net having a number of pseudo scalar nets that are each uniquely identified as being associated with the corresponding vectored net, a first portion of the number of circuit objects receive at least one vectored net and a second portion of the number of circuit objects receive at least one scalar net, selected ones of the circuit objects being placed via the placement tool thereby resulting in a number of placed circuit objects, selected ones of the placed circuit objects and the corresponding vectored and scalar nets being displayed by the placement tool on a display device, the method comprising the steps of:

a. selecting a number of the placed circuit objects thereby resulting in a number of selected placed circuit objects;
   b. identifying which of the number of vectored nets are received by the selected placed circuit objects, thereby resulting in a number of identified vectored nets; and
   c. visually distinguishing the identified vectored nets from the remaining number of vectored and scalar nets on the display device.

2. A method according to claim 1 wherein said circuit design database stores, for each of selected ones of the number of circuit objects, a net I/O list which identifies the vectored nets and the scalar nets received thereby.

3. A method according to claim 2 wherein said identifying step identifies which of the number of vectored nets are received by the selected placed circuit objects by examining the corresponding net I/O list.

4. A method according to claim 3 wherein the pseudo scalar nets associated with a particular vectored net include a vectored net,identifier indicating the association.

5. A method according to claim 4 wherein said vectored net identifier is a predefined net name format.

6. A method according to claim 5 wherein said predefined net name format includes a prefix which is identical for all pseudo scalar nets associated with a particular vectored net, and which uniquely identifies the association between the particular vectored net and the corresponding pseudo scalar nets.

7. A method according to claim 6 wherein said predefined net name format further comprises a suffix which identifies a vector position of the corresponding pseudo scalar net within the particular vectored net.

8. A method according to claim 7 wherein said identifying step identifies which of the scalar nets are pseudo scalar nets by determining if the suffix of the net name identifies a vector position, and thus identifies the vectored nets within the circuit design database.

9. A method according to claim 8 wherein said identifying step identifies which of the number of vectored nets are received by the selected placed circuit objects by storing the prefix of the vectored nets contained in the corresponding net I/O list.

10. A method according to claim 1 wherein said visually distinguishing step visually distinguishes the identified vectored nets from the remaining number of vectored and scalar nets by only displaying the identified vectored nets.

11. A method according to claim 1 wherein said visually distinguishing step visually distinguishes the identified vectored nets from the remaining number of vectored and scalar nets by displaying the identified vectored nets in a different color from the remaining number of vectored and scalar nets.

12. A method according to claim 1 wherein said visually distinguishing step visually distinguishes the identified vectored nets from the remaining number of vectored and scalar nets by displaying the identified vectored nets in a highlighted form.

13. A method for viewing vectored nets within a circuit design database using a placement tool, the circuit design database including a number of circuit objects, a number of vectored nets and a number of scalar nets, each vectored net having a number of pseudo scalar nets that are each uniquely identified as being associated with the corresponding vectored net, a first portion of the number of circuit objects drive at least one vectored net and a second portion of the number of circuit objects drive at least one scalar net, selected ones of the circuit objects being placed via the placement tool thereby resulting in a number of placed circuit objects, selected ones of the placed circuit objects and the corresponding vectored and scalar nets being displayed by the placement tool on a display device, the method comprising the steps of:

a. selecting a number of the placed circuit objects thereby resulting in a number of selected placed circuit objects;

b. identifying which of the number of vectored nets are driven by the selected placed circuit objects, thereby resulting in a number of identified vectored nets; and c. visually distinguishing the identified vectored nets from the remaining number of vectored and scalar nets on the display device.

14. A method according to claim 13 wherein said circuit design database stores, for each of selected ones of the number of circuit objects, a net I/O list which identifies the vectored nets and which of the scalar nets are driven thereby.

15. A method according to claim 14 wherein said identifying step identifies which of the number of vectored nets are driven by the selected placed circuit objects by examining the corresponding net I/O list.

16. A method according to claim 15 wherein the pseudo scalar nets associated with a particular vectored net include a vectored net identifier indicating the association.

17. A method according to claim 16 wherein said vectored net identifier is a predefined net name format.

18. A method according to claim 17 wherein said predefined net name format includes a prefix which is identical for all pseudo scalar nets associated with a particular vectored net, and which uniquely identifies the association between the particular vectored net and the corresponding pseudo scalar nets.

19. A method according to claim 18 wherein said predefined net name format further comprises a suffix which identifies a vector position of the corresponding pseudo scalar net within the particular vectored net.

20. A method according to claim 19 wherein said identifying step identifies which of the scalar nets are indeed pseudo scalar nets by determining if the suffix of the net name identifies a vector position, and thus identifies the vectored nets within the circuit design database.

21. A method according to claim 20 wherein said identifying step identifies which of the number of vectored nets are driven by the selected placed circuit objects by storing the prefix of the vectored nets contained in the corresponding net I/O list.

22. A method for viewing nets that are coupled to unplaced objects within a circuit design using a placement tool, the circuit design being represented in a circuit design database, wherein the circuit design database includes a number of circuit objects, a driving circuit object including an output that drives a connecting net, the connecting net connecting the output of the driving circuit object with an input of a first receiving circuit object and an input of a second receiving circuit object, the connecting net including a first portion connecting the output of the driving circuit object to the input of the first receiving circuit object and a second portion that connects the output of the driving circuit object to the input of the second receiving circuit object, the driving circuit object and the first receiving circuit object being placed at predetermined locations, the method comprising the steps of:

a. displaying the driving circuit object, the first receiving circuit object, and the first portion of the connecting net on the display device;

b. determining a location representative of an approximate expected placement location for the second receiving circuit object; and c. displaying the second portion of the connecting net extending from the driving circuit object to the approximate expected placement location.

23. A method according to claim 22 wherein the circuit design database includes a number of levels of hierarchy, wherein predetermined objects are hierarchical parents to predetermined other objects.

24. A method according to claim 23 wherein said approximate expected location determined by said determining step is a predetermined location within the first placed hierarchical parent containing the second receiving circuit object.

25. A method according to claim 23 wherein a predetermined parent object is the hierarchical parent to the second receiving circuit object.

26. A method according to claim 25 wherein the predetermined parent object is placed at a predetermined location.

27. A method according to claim 26 wherein said approximate expected location determined by said determining step is the center of the predetermined parent object.

28. A method for viewing selected vectored nets within a circuit design database using a database editor tool, the circuit design database including a number of circuit objects and a number of vectored nets wherein each of the vectored nets has a number of pseudo scalar nets associated therewith, the number of vectored nets each having a vector width indicating the number of pseudo scalar nets associated with the corresponding vectored net, the database editor tool displaying at least a portion of the circuit design database on a display device, the method comprising the steps of:

a. selecting a vector width limit;

b. identifying which of the number of vectored nets have a vector width that satisfy a predetermined relationship with the selected vector limit, thereby resulting in a number of identified vectored nets; and c. visually distinguishing the identified vectored nets from the remaining number of vectored nets on the display device.

29. A method for viewing selected vectored nets within a circuit design database using a placement tool, the circuit design database including a number of circuit objects and a number of vectored nets wherein each of the vectored nets has a number of pseudo scalar nets associated therewith, the number of vectored nets each having a vector width indicating the number of pseudo scalar nets associated with the corresponding vectored net, the placement tool displaying at least a portion of the circuit design database on a display device, the method comprising the steps of:

a. selecting a vector width limit;

b. identifying which of the number of vectored nets have a vector width that satisfy a predetermined relationship with the selected vector limit, thereby resulting in a number of identified vectored nets; and c. visually distinguishing the identified vectored nets from the remaining number of vectored nets on the display device.

30. A method according to claim 29 wherein said identifying step identifies which of the number of vectored nets have a vector width that is higher than the selected vector width limit.

31. A method according to claim 29 wherein said identifying step identifies which of the number of vectored nets have a vector width that is lower than the selected vector width limit.

32. A method according to claim 29 wherein said selecting step selects a lower vector width limit and an upper vector width limit.

33. A method according to claim 32 wherein said identifying step identifies which of the number of vectored nets have a vector width that is higher than the lower vector width limit and lower than the upper vector limit width.

34. A method according to claim 30 wherein each of said pseudo scalar nets have a corresponding net name in a predefined net name format, the predefined net name format including a prefix which is identical for all pseudo scalar nets associated with a particular vectored net, and which uniquely identifies the association between the particular vectored net and the corresponding pseudo scalar nets.

35. A method according to claim 34 wherein said predefined net name format further comprises a suffix which identifies a vector position of the corresponding pseudo scalar net within the particular vectored net.

36. A method according to claim 35 wherein said identifying step identifies which of the vectored nets have a vector width that is larger than the vector width limit by determining if any of the pseudo scalar nets associated with each vectored net have a suffix which indicates a bit position that is equal to or greater than, by a predetermined amount, the vector width limit.

37. A method for viewing vectored nets within a circuit design database using a database editor tool, the placement tool displaying at least a portion of the circuit design database on a display device, the circuit design database including a number of circuit objects and a number of nets, and further includes a number of levels of hierarchy, wherein predetermined ones of the circuit objects are hierarchical parents to predetermined other ones of the circuit objects, each of the hierarchical parent circuit objects having a predefined hierarchical boundary, wherein a number of the nets cross at least one of the hierarchical boundaries, the method comprising the steps of:
  a. selecting a parent circuit object, wherein the selected parent circuit object has a selected hierarchical boundary;
  b. identifying which of the number of nets cross the selected hierarchical boundary, thereby resulting in a number of identified nets; and
  c. visually distinguishing the identified nets from the remaining nets, on the display device.

38. A method for viewing vectored nets within a circuit design database using a placement tool, the placement tool displaying at least a portion of the circuit design database on a display device, the circuit design database including a number of circuit objects and a number of nets, and further includes a number of levels of hierarchy, wherein predetermined ones of the circuit objects are hierarchical parents to predetermined other ones of the circuit objects, each of the hierarchical parent circuit objects having a predefined hierarchical boundary, wherein a number of the nets cross at least one of the hierarchical boundaries, the method comprising the steps of:
  a. selecting a parent circuit object, wherein the selected parent circuit object has a selected hierarchical boundary;
  b. identifying which of the number of nets cross the selected hierarchical boundary, thereby resulting in a number of identified nets; and
  c. visually distinguishing the identified nets from the remaining nets, on the display device.

39. A method according to claim 38 wherein said circuit design database stores, for each of the number of parent circuit objects, a net I/O list which identifies the nets which cross the corresponding hierarchical boundary.

40. A method according to claim 39 wherein said identifying step identifies which of the number of nets cross the selected hierarchical boundary by examining the net I/O list that is associated with the selected parent circuit object.

41. A method according to claim 38 wherein a number of the number of nets are vectored nets.

42. A method according to claim 38 wherein said visually distinguishing step visually distinguishes the identified nets from the remaining nets by only displaying the identified nets.

43. A method according to claim 38 wherein said visually distinguishing step visually distinguishes the identified nets from the remaining nets by displaying the identified nets in a different color than the remaining nets.

44. A method according to claim 38 wherein said visually distinguishing step visually distinguishes the identified nets from the remaining nets by displaying the identified nets in a highlighted form.

45. A data processing system for viewing vectored nets within a circuit design database, the circuit design database including a number of circuit objects, a number of vectored nets and a number of scalar nets, each vectored net having a number of pseudo scalar nets that are each uniquely identified as being associated with the corresponding vectored net, a first portion of the number of circuit objects receive at least one vectored net and a second portion of the number of circuit objects receive at least one scalar net, selected ones of the circuit objects being placed thereby resulting in a number of placed circuit objects, selected ones of the placed circuit objects and the corresponding vectored and scalar nets being displayed on a display device, the data processing system comprising:
  a. selecting means for selecting a number of the placed circuit objects thereby resulting in a number of selected placed circuit objects;
  b. identifying means coupled to said selecting means for identifying which of the number of vectored nets are received by the selected placed circuit objects, thereby resulting in a number of identified vectored nets; and
  c. visually distinguishing means coupled to said identifying means for visually distinguishing the identified vectored nets from the remaining number of vectored and scalar nets on the display device.

46. A data processing system for viewing vectored nets within a circuit design database, the circuit design database including a number of circuit objects, a number of vectored nets and a number of scalar nets, each vectored net having a number of pseudo scalar nets that are each uniquely identified as being associated with the corresponding vectored net, a first portion of the number of circuit objects drive at least one vectored net and a second portion of the number of circuit objects drive at least one scalar net, selected ones of the circuit objects being placed thereby resulting in a number of placed circuit objects, selected ones of the placed circuit objects and the corresponding vectored and scalar nets being displayed on a display device, the data processing system comprising:
  a. selecting means for selecting a number of the placed circuit objects thereby resulting in a number of selected placed circuit objects;
  b. identifying means coupled to said selecting means for identifying which of the number of vectored nets are driven by the selected placed circuit objects, thereby resulting in a number of identified vectored nets; and c. visually distinguishing means coupled to said identifying means for visually distinguishing the identified vectored nets from the remaining number of vectored and scalar nets on the display device.

47. A data processing system for viewing nets that are coupled to unplaced objects within a circuit design, the circuit design being represented in a circuit design database, wherein the circuit design database includes a number of circuit objects, a driving circuit object including an output that drives a connecting net, the connecting net connecting the output of the driving circuit object with an input of a first receiving circuit object and an input of a second receiving circuit object, the connecting net including a first portion connecting the output of the driving circuit object to the input of the first receiving circuit object and a second portion that connects the output of the driving circuit object to the input of the second receiving circuit object, the driving circuit object and the first receiving circuit object being placed at predetermined locations, the data processing system comprising:

a. first displaying means for displaying the driving circuit object, the first receiving circuit object, and the first portion of the connecting net on the display device;

b. determining means for determining a location representative of an approximate expected placement location for the second receiving circuit object; and c. second displaying means coupled to said determining means for displaying the second portion of the connecting net extending from the driving circuit object to the approximate expected placement location.

48. A data processing system for viewing selected vectored nets within a circuit design database, the circuit design database including a number of circuit objects and a number of vectored nets wherein each of the vectored nets has a number of pseudo scalar nets associated therewith, the number of vectored nets each having a vector width indicating the number of pseudo scalar nets associated with the corresponding vectored net, at least a portion of the circuit design database being displayed on a display device, the data processing system comprising:

a. selecting means for selecting a vector width limit;

b. identifying means coupled to said selecting means for identifying which of the number of vectored nets have a vector width that satisfy a predetermined relationship with the selected vector limit, thereby resulting in a number of identified vectored nets; and c. visually distinguishing means coupled to said identifying means for visually distinguishing the identified vectored nets from the remaining number of vectored nets on the display device.

49. A data processing system for viewing vectored nets within a circuit design database, the data processing system displaying at least a portion of the circuit design database on a display device, the circuit design database including a number of circuit objects and a number of nets, and further includes a number of levels of hierarchy, wherein predetermined ones of the circuit objects are hierarchical parents to predetermined other ones of the circuit objects, each of the hierarchical parent circuit objects having a predefined hierarchical boundary, wherein a number of the nets cross at least one of the hierarchical boundaries, the data processing system comprising:

a. selecting means for selecting a selected parent circuit object, wherein the selected parent circuit object has a selected hierarchical boundary;

b. identifying means coupled to said selecting means for identifying which of the number of nets cross the selected hierarchical boundary, thereby resulting in a number of identified nets; and c. visually distinguishing means coupled to said identifying means for visually distinguishing the identified nets from the remaining nets, on the display device.

* * * * *